United States Patent
Thalaimalaivanaraj et al.

(10) Patent No.: US 10,535,383 B2
(45) Date of Patent: Jan. 14, 2020

(54) THROUGHPUT PERFORMANCE FOR CROSS TEMPERATURE HANDLING SCENARIOS

(71) Applicant: SanDisk Technologies LLC, Plano, TX (US)

(72) Inventors: Anantharaj Thalaimalaivanaraj, Bangalore (IN); Suman Tenugu, Bangalore (IN); Arun Thandapani, Bangalore (IN); Dharmaraju Marenahally Krishna, Bangalore (IN); Sainath Viswasarai, Bangalore (IN)

(73) Assignee: SANDISK TECHNOLOGIES LLC, Plano, TX (US)

( * ) Notice: Subject to any disclaimer, the term of this patent is extended or adjusted under 35 U.S.C. 154(b) by 4 days.

(21) Appl. No.: 15/908,472

(22) Filed: Feb. 28, 2018

(65) Prior Publication Data
US 2019/0267054 A1   Aug. 29, 2019

(51) Int. Cl.
| *G11C 7/22* | (2006.01) |
| *G11C 7/10* | (2006.01) |
| *G11C 29/12* | (2006.01) |
| *G06F 11/10* | (2006.01) |
| *G11C 29/52* | (2006.01) |
| *G11C 16/26* | (2006.01) |
| *G11C 7/04* | (2006.01) |
| *G11C 11/56* | (2006.01) |

(52) U.S. Cl.
CPC ............ *G11C 7/22* (2013.01); *G06F 11/1068* (2013.01); *G11C 7/04* (2013.01); *G11C 7/1057* (2013.01); *G11C 7/1078* (2013.01); *G11C 16/26* (2013.01); *G11C 29/12* (2013.01); *G11C 29/52* (2013.01); *G11C 11/56* (2013.01)

(58) Field of Classification Search
CPC ....... G11C 7/22; G11C 7/1057; G11C 7/1078; G11C 29/12; G11C 29/52; G11C 11/56; G06F 11/1068
See application file for complete search history.

(56) References Cited

U.S. PATENT DOCUMENTS

| 8,154,921 | B2 | 4/2012 | Mokhlesi | |
| 9,472,298 | B1 | 10/2016 | Louie | |
| 9,530,512 | B2 | 12/2016 | Ray | |
| 9,543,028 | B2 | 1/2017 | Ray | |
| 9,760,311 | B1 | 9/2017 | Amir | |
| 9,811,267 | B1 | 11/2017 | Yang | |
| 2017/0090822 | A1* | 3/2017 | Yadav | G06F 3/0616 |
| 2017/0255403 | A1 | 9/2017 | Sharon | |
| 2018/0143788 | A1* | 5/2018 | Yadav | G06F 3/0616 |

* cited by examiner

*Primary Examiner* — Guy J Lamarre
(74) *Attorney, Agent, or Firm* — Foley & Lardner LLP

(57) ABSTRACT

A die includes a plurality of memory cells. The die also includes a calculation circuit configured to determine a difference between a write temperature and a read temperature in response to a read request for user data stored in the memory cells. The die further includes a notification circuit configured to signal a cross-temperature condition in response to the difference satisfying a threshold.

22 Claims, 11 Drawing Sheets

THROUGHPUT PERFORMANCE FOR CROSS TEMPERATURE HANDLING SCENARIOS

FIELD OF THE DISCLOSURE

This disclosure is generally related to data storage devices and more particularly to cross-temperature memory device signaling techniques.

BACKGROUND

Non-volatile data storage devices, such as flash solid state memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 2 bits per cell, 3 bits per cell, 4 bits per cell, or more. Although increasing the number of bits per cell and reducing device feature dimensions may increase a storage density of a memory device, a bit error rate (BER) for data stored at the memory device may also increase.

In addition, increased BER due to temperature changes between programming temperature (e.g., a temperature of memory cells when data is written to the memory) and later reading temperature (e.g., a temperature of the memory cells when the data is read from the memory) is becoming an increasingly significant issue in recent memory generations.

DETAILED DESCRIPTION

Figure 1:
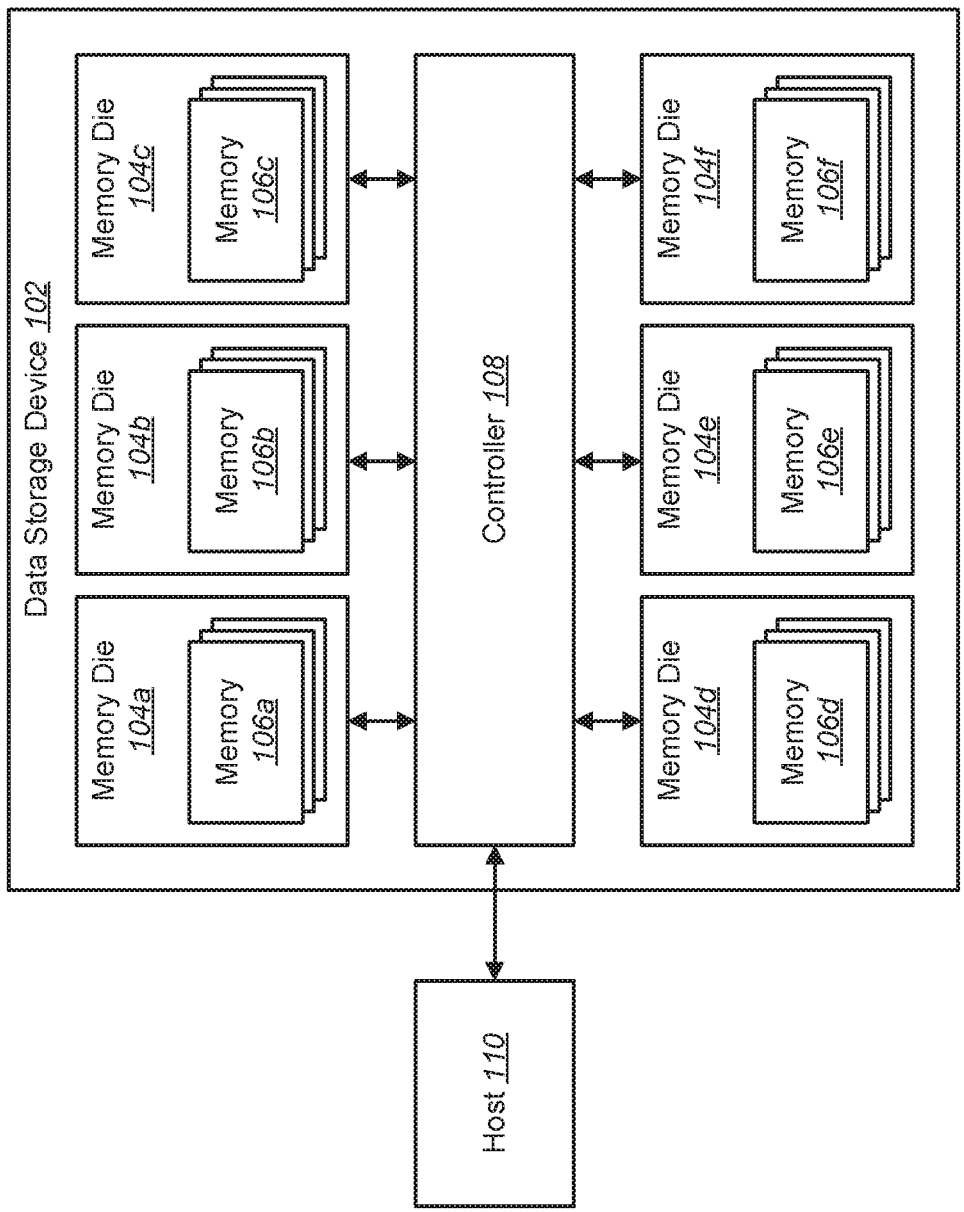
FIG. 1 is a block diagram illustrating an example of a data storage device and a host.

Systems and methods for memory device signaling in potential cross-temperature condition scenarios are disclosed herein. A cross-temperature condition is a device state or condition caused by a temperature difference between a write temperature and a read temperature of data stored on a memory device (e.g., on a WL of a memory device). A write temperature is a temperature of memory (e.g., one or more memory cells, registers, word lines (WLs), and/or pages) at or near a time data is programmed or written to the memory. A read temperature is a temperature of memory (e.g., one or more memory cells, registers, WLs, and/or pages) at or near a time data is read from the memory. As the temperature difference between the write temperature and read temperature increases, voltage distributions corresponding to data states of a memory cell change (e.g., shift and/or spread). The cross-temperature condition leads to higher BER or fail bit count (FBC) during a read operation. Some approaches for handling cross-temperature condition scenarios involve significant amounts of overhead. In one approach, a controller receives data from a memory device. The controller may determine that a cross-temperature condition has occurred or is occurring. Consequently, the data is re-read with different read settings and received from the memory device. The controller then determines if the cross-temperature condition effect is mitigated. If so, then the controller uses the re-read data. If not, the controller may resort to other data recovery techniques, including another reading of the data with further adjusted read settings. This approach impacts performance, since a large amount of data is passed between the memory device and the controller. Other data recovery techniques may include error correction coding (ECC) or low-density parity check codes (LDPC) data recovery. The performance impact is problematic, particularly in scenarios where significant temperature differences occur (e.g., automotive products, industrial products). As can be observed, systems and methods for addressing the cross-temperature condition effect are needed.

Embodiments of the systems and methods disclosed herein help alleviate the performance impact in potential cross-temperature condition scenarios. For example, cross-temperature condition detection is performed at the memory device (e.g., a memory die) level without transmitting user data to a controller. Accordingly, signaling between the memory device and the controller is reduced, which improves performance.

As used herein, the term "memory device" is a device that includes one or more memory die. A "memory die" is a memory circuit (e.g., a chip or integrated circuit) that includes memory (e.g., memory cells, one or more registers, WLs, and/or pages) for storing electronic data. As used herein, the term "circuit" or "circuitry" refers to one or more electronic components (e.g., transistors, resistors, capacitors, inductors, and/or conductive couplings, etc.). Examples of a "circuit" or "circuitry" may include one or more integrated circuits, printed circuit boards (PCBs), etc. "Memory" is an electronic device capable of storing electronic information or data. A "memory cell" may be an electronic component or circuit capable of storing electronic information or data (e.g., one or more bits). Examples of memory cells include floating gate transistors, NAND flash cells, NOR flash cells, flip-flop circuits, latches, etc.

Some embodiments of the systems and methods disclosed herein are implemented in accordance with one or more of the following structures and/or operations. A memory device is configured to perform temperature comparison for a requested read and/or is configured to detect a cross-temperature condition for a host and/or controller. In some approaches, a write temperature (a temperature at the time of a write or program operation) is stored in memory (e.g., in word line (WL) and/or page data). A read temperature (a temperature at the time of a read operation) is determined from a temperature sensor. The memory device determines a difference between the write temperature and the read temperature. The memory device compares the difference to a threshold (e.g., a trim parameter value or an input value) to determine whether a cross-temperature condition exists. For example, a die (e.g., memory die) includes a calculation circuit. The calculation circuit implements logic (e.g., logic in hardware and/or firmware) to perform calculations. The calculation circuit, in one embodiment, is configured to determine a difference between the write temperature and the read temperature. In one embodiment, the difference is determined in response to a read request for data stored in the memory. The die also includes a notification circuit. The notification circuit implements logic (e.g., logic in hardware and/or firmware) to provide notifications to other circuitry (e.g., to a controller). The notification circuit is configured to signal a cross-temperature condition in response to the difference satisfying a threshold.

Embodiments of the systems and methods disclosed herein may be implemented for a variety of non-volatile memory (NVM) types. For example, embodiments may be implemented in flash memory devices (e.g., NAND or NOR), phase-change memory (PCM) devices, resistive random-access memory (ReRAM) devices, magnetoresistive random-access memory (MRAM) devices, spin-transfer torque (STT) MRAM, spin-orbit torque (SOT) MRAM, ferroelectric random-access memory (F-RAM), holographic memory devices, and any other type of non-volatile memory devices.

As described above, a cross-temperature condition is a condition in which the temperature difference between the read temperature and the write temperature is at or beyond a threshold (e.g., a difference of 65 degrees Celsius or greater). For example, writing data at a first temperature and then reading the data at a significantly different temperature may result in too many errors. For instance, as the temperature difference increases, the BER or FBC increases. Accordingly, a cross-temperature condition may be a condition where BER or FBC is likely to be larger than a tolerable amount. The memory device (e.g., notification circuit) signals a cross-temperature condition (e.g., a special status command) to the controller if the difference satisfies the threshold. In the case of a cross-temperature condition, one or more procedures are followed to reduce and/or avoid errors caused by the temperature difference. For example, the spread and/or shift of the voltage distributions are accounted for by adjusting read thresholds to reduce and/or avoid errors. In some approaches, a mechanism may be implemented to determine one or more optimum read voltages. More detail regarding the cross-temperature condition is given in connection with FIG. 2.

In one embodiment, the controller performs one or more "write path" operations to write data to the memory device. For example, the controller determines (e.g., reads, receives, obtains, etc.) a temperature from a temperature sensor on the memory device. The controller adds the temperature as a write temperature (in a page header, for example) to user data and sends the write temperature and the user data to the memory device to be written into memory (e.g., NAND or NOR memory).

For "read path" operations, intensive input/output (IO) operations are offloaded to the memory device by adding internal logic to the memory device. For example, the memory device sends an indicator (e.g., a special status command) to the controller indicating whether there is a cross-temperature condition corresponding to a particular operation (e.g., WL operation).

In an embodiment, memory-device level handling includes one or more of the following read path operations (for a specific WL, for example). The memory device stores a threshold for detecting a cross-temperature condition. In some approaches, a trim parameter is created and/or utilized to hold the threshold. Additionally or alternatively, the threshold is received as a user input value. The memory device is configured to determine the write temperature (stored in memory or NAND, etc.) and a read temperature (from a temperature sensor). The memory device is configured to calculate a difference between the write temperature and the read temperature. The memory device is configured to compare the difference to the threshold. The memory device outputs (e.g., transmit) a comparison result (e.g., an indicator of whether the difference satisfies the threshold). In some approaches, the indicator is a special status command. In a case that a cross-temperature condition is indicated, the memory device reads (e.g., re-reads) user data from memory using error correction. For example, the controller sends read voltage sequences to adjust one or more read voltage thresholds, and the memory device reads user data from memory using the adjusted read threshold(s).

The dynamic read threshold technique adjusts one or more read threshold voltages in order to more accurately read the user data. In one embodiment, adjusting read thresholds is performed based on the difference between the read temperature and the write temperature logged. The read thresholds adjustment value may also be a function of the logged programming temperature (and not only of the temperature difference), in case the shifting is different when programming at low temperature versus high temperature. The read thresholds adjustment is performed using a predefined table as a function of the temperature difference and optionally as a function of the programming temperature. Alternatively, read thresholds adjustment is be performed by running a read thresholds calibrations algorithm, such as cell voltage distribution (CVD) tracking or BER Estimation Scan (BES), on representative page(s) from the block(s) that were programmed at the same temperature. The above operations (e.g., CVD tracking, BES operations, storing write temperatures, and/or adjusting read voltages based on temperature change) may be used to compensate for voltage shifting due to the difference between write temperature and read temperature.

Particular examples in accordance with the disclosure are described below with reference to the drawings. In the description, common features may be designated by common reference numbers. Similar or exemplary features may be designated with similar reference numbers. As used herein, "exemplary" may indicate an example, an implementation, and/or an aspect, and should not be construed as limiting or as indicating a preference or a preferred implementation. Further, it is to be appreciated that certain ordinal terms (e.g., "first" or "second") may be provided for identification and ease of reference and may not necessarily imply physical characteristics or ordering. Therefore, as used herein, an ordinal term (e.g., "first," "second," "third") used to modify an element, such as a structure, a component, an operation, etc., does not necessarily indicate priority or order of the element with respect to another element, but rather distinguishes the element from another element having a same name (but for use of the ordinal term). In addition, as used herein, indefinite articles ("a" and "an") may indicate "one or more" rather than "one." As used herein, a structure or operation that "comprises" or "includes" an element may include one or more other elements not explicitly recited. Further, an operation performed "based on" a condition or event may also be performed based on one or more other conditions or events not explicitly recited.

It should be noted that multiple similar elements may be labeled with a number and a letter (e.g., memory die 104*a-f*). When an element is referred to by the number without a letter, this may generally refer to any one of the illustrated elements with the number, to some of the illustrated elements with the number, to all of the illustrated elements with the number, or to another similar element. For example, a "memory die 104" may generally refer to one or more of the memory die 104*a-f* illustrated in the figures.

FIG. 1 is a block diagram illustrating an example of a data storage device 102 and a host 110 (e.g., a host device or another device). The data storage device 102 and the host 110 are coupled via a connection (e.g., a communication path), such as a bus or a wireless connection. The data storage device 102 includes an interface (e.g., an access device or host interface, not shown in FIG. 1) that enables communication via the communication path between the data storage device 102 and the host 110.

The data storage device 102 includes, or corresponds to, memory which may be included in, or distinct from (and accessible to), the host 110. For example, the data storage device 102 includes or corresponds to a non-volatile memory device, which is used as an embedded memory (e.g., a mobile embedded storage device), an enterprise storage drive (ESD), a client storage device, or a cloud storage device, as illustrative, non-limiting examples. In some implementations, the data storage device 102 is coupled to the host 110 indirectly, e.g., via a network. For example, the network includes a data center storage system network, an enterprise storage system network, a storage area network, a cloud storage network, a local area network (LAN), a wide area network (WAN), the Internet, and/or another network. In some implementations, the data storage device 102 is a network-attached storage (NAS) device or a component (e.g., a solid-state storage device) of a data center storage system, an enterprise storage system, or a storage area network.

In an embodiment, the data storage device 102 is embedded within the host 110, such as in accordance with a Joint Electron Devices Engineering Council (JEDEC) Solid State Technology Association Universal Flash Storage (UFS) configuration. For example, the data storage device 102 is configured to be coupled to the host 110 as embedded memory, such as eMMC® (trademark of JEDEC Solid State Technology Association, Arlington, Virginia) and eSD, as illustrative examples. To illustrate, the data storage device 102 corresponds to an eMMC (embedded MultiMedia Card) device. As another example, the data storage device 102 corresponds to a memory card, such as a Secure Digital (SD®) card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of Western Digital Corporation, San Jose, Calif.). Alternatively, the data storage device 102 is removable from the host 110 (i.e., "removably" coupled to the host 110). As an example, the data storage device 102 is removably coupled to the host 110 in accordance with a removable universal serial bus (USB) configuration.

In an embodiment, the data storage device 102 operates in compliance with an industry specification. For example, the data storage device 102 is configured to communicate with the host 110 using a small computer system interface (SCSI)-type protocol, such as a serial attached SCSI (SAS) protocol. As other examples, the data storage device 102 is configured to communicate with the host 110 using a NVM Express (NVMe) protocol or a serial advanced technology attachment (SATA) protocol. In other examples, the data storage device 102 operates in compliance with a JEDEC eMMC specification, a JEDEC Universal Flash Storage (UFS) specification, one or more other specifications, or a combination thereof, and is configured to communicate using one or more protocols, such as an eMMC protocol, a universal flash storage (UFS) protocol, a universal serial bus (USB) protocol, and/or another protocol, as illustrative, non-limiting examples.

In one embodiment, the host 110 includes a data storage interface (not shown) and is configured to communicate with a controller 108 of the data storage device 102 via the data storage interface to read data from and write data to one or more memory die 104 of the data storage device 102. For example, the host 110 is configured to communicate with the data storage device 102 using a SAS, SATA, or NVMe protocol. As other examples, the host 110 operates in compliance with a Joint Electron Devices Engineering Council (JEDEC) industry specification, such as a Universal Flash Storage (UFS) Access Controller Interface specification. The host 110 communicates with one or more memory die 104 in accordance with any other suitable communication protocol.

In one embodiment, the host 110 includes a processor and a memory. The memory is configured to store data and/or instructions that are executable by the processor. The memory is a single memory or multiple memories, such as one or more non-volatile memories, one or more volatile memories, or a combination thereof. The host 110 issues one or more commands to the data storage device 102, such as one or more requests to re-write data, erase data, read data from, or write data to the one or more memory die 104*a-f* of the data storage device 102. For example, the host 110 is configured to provide data (e.g., user data) to be stored in the memory die(s) 104*a-f* or to request data to be read from the memory die(s) 104*a-f*. Examples of the host 110 include a mobile telephone, a computer (e.g., a laptop, a tablet, or a notebook computer), a music player, a video player, a gaming device or console, an electronic book reader, a personal digital assistant (PDA), a portable navigation device, a computer, such as a laptop computer or notebook computer, a network computer, a server, any other electronic device, or any combination thereof, as illustrative, non-limiting examples.

The data storage device 102 includes one or more memory die 104 (e.g., one memory die, two memory die, eight memory die, or another number of memory die). For example, while six memory die 104*a-f* are illustrated in FIG. 1, one or more memory die 104 may be included in the data storage device 102. Each of the memory die 104*a-f* includes a memory 106*a-f*, such as a non-volatile memory of storage elements. For example, the memory 106 includes a flash memory (e.g., NAND or NOR), PCM, ReRAM, MRAM, F-RAM, holographic memory, and/or any other type of non-volatile memory (NVM). The memory 106 may have a three-dimensional (3D) memory configuration. As an example, the memory 106 has a 3D vertical bit line (VBL) configuration. In a particular implementation, the memory 106 is a non-volatile memory having a 3D memory configuration that is monolithically formed in one or more physical levels of arrays of memory cells having an active area disposed above a silicon substrate. Alternatively, the memory 106 has another configuration, such as a two-dimensional (2D) memory configuration or a non-monolithic 3D memory configuration (e.g., a stacked die 3D memory configuration).

In an embodiment, the data storage device 102 includes multiple memory die 104*a-f* that are configured similarly. For example, the data storage device 102 includes multiple memory die 104*a-f*, each of the memory die 104*a-f* including one or more memories 106*a-f*. Data striping and error recovery as described with respect to pages of the memory 106 may be extended to include data striping and error recovery across multiple die, across multiple packages, across multiple memory devices, or any combination thereof.

In one embodiment, the memory 106 includes one or more erase blocks, such as a NAND flash erase block of storage elements. Each storage element of the memory 106 is programmable to a state (e.g., a threshold voltage in a flash configuration or a resistive state in a resistive memory configuration) that indicates one or more values. Each erase block of the memory 106 includes one or more word lines. Each word line includes one or more pages, such as one or more physical pages. In one embodiment, each page is configured to store a codeword. A word line is configurable to operate as a single-level-cell (SLC) word line, as a multi-level-cell (MLC) word line, or as a tri-level-cell (TLC) word line, as illustrative, non-limiting examples.

In an embodiment, each memory die 104 includes other circuitry. For example, a memory die 104 includes a read/write circuit, a temperature sensor, a calculation circuit, a comparison circuit, and/or a notification circuit. The read/write circuit reads data from and/or writes data to the memory 106. The temperature sensor detects a temperature of the memory 106 and/or memory die 104. The calculation circuit calculates a difference between a read temperature and a write temperature of data stored in the memory 106. The comparison circuit compares the difference to a threshold. The notification circuit communicates an indicator to the controller 108 indicating whether the difference satisfies the threshold. The read/write circuit, temperature sensor, calculation circuit, comparison circuit, and notification circuit are described in greater detail in connection with FIG. 3.

As illustrated in FIG. 1, the controller 108 interfaces with multiple memory die 104*a-f*. In one embodiment, the controller 108 is a system-level controller that manages all the memory die 104*a-f*. The controller 108 receives read requests from the host 110 and services the read request by sending the requested data back to the host 110. A read request is a command from the host that includes an address for the desired data and either a predefined quantity of the data requested or a variable quantity of requested data. The controller 108 interprets that read request and reads data from one or more of the memory die 104*a-f*.

Figure 2:
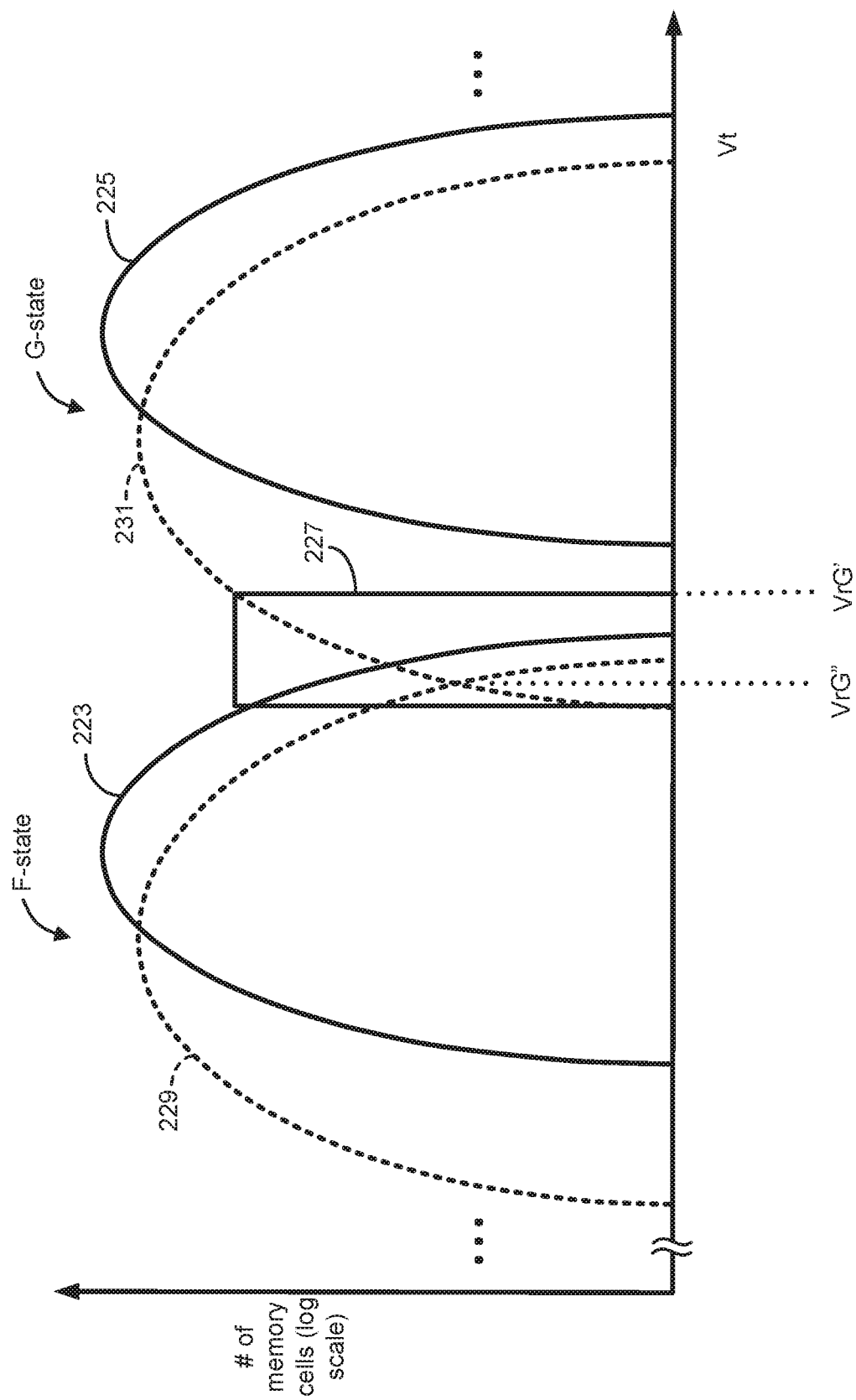
FIG. 2 is a diagram illustrating threshold voltage distributions.

FIG. 2 shows threshold voltage distributions for two data states (i.e., the F-state and the G-state), each for two points in time. A data state of memory cells indicates the stored data of the memory cells. For example, each data state maps to one or more bits. Although just two data states are illustrated in FIG. 2, many other data states may be utilized. For example, more data states are used to represent other numbers of bits. One or more additional data states (not illustrated in FIG. 2) may be configured below (e.g., states A-E) and/or above the F-state and the G-state. For instance, one or more other threshold voltage curves (not illustrated in FIG. 2) below and/or above the illustrated curves 223, 225, 229, 231 may be utilized.

Curves 223 and 225 show threshold voltage (Vt) distributions corresponding to a time when (e.g., just after) memory cells were programmed at a write temperature. Curves 229 and 231 show Vt distributions corresponding to a time when the memory cells are read at a read temperature. (The read and write temperatures may be within, for example, the following ranges: 85° C. to −25° C., 125° C. to −40° C., or 85° C. to −2° C.) At the write temperature, there is a significant gap between the F-state and G-state. However, at a significantly different read temperature, the threshold voltages shift. For example, if the memory device is in a hot environment, such as an automobile, the threshold voltages may shift and/or spread. As described above, a cross-temperature condition occurs when a difference between read temperature and write temperature is significant (e.g., larger than a threshold).

Curve 231 shows a possible shift for the threshold distribution of the G-state. In this example, the threshold voltages have in general shifted downward. Also, there has been some spreading of the range of the threshold voltages. Curve 229 shows a possible shift for the threshold distribution of the F-state. Similar to the G-state, the threshold voltages for the F-state have in general shifted downward. Also, there has been some spreading of the range of the threshold voltages. Note that other shifts in the threshold voltages are possible.

Voltage level VrG' represents a read threshold that is suitable for use when the read temperature is close to the write temperature. Voltage level VrG' is a preferred read threshold because there is sufficient area between curve 223 and 225 that minimal bit errors may be detected. Voltage level VrG" represents a read threshold that is suitable for use in a cross-temperature condition, where the threshold voltage distributions have shifted to curves 229 and 231. In this example, read threshold VrG" corresponds to the valley of curves 229 and 231 (where the curves first intersect), although a different read threshold might be used. In one embodiment, the intersection between the curves or "valley" is an optimum read voltage. Memory cells with a Vt below VrG" but that were programmed to state G will read as bit errors. Memory cells with a Vt above VrG" but that were programmed to state F will read as bit errors. While there are still bit errors when reading at VrG", there are fewer of them than if the read was done at VrG'.

Note that if read threshold VrG' were to be used after the threshold voltage distributions have shifted to curves 229 and 231, then memory cells on curve 231 with threshold voltages below VrG' would be misread. In general, box 227 represents memory cells with threshold voltages on curve 231 that would be misread if read threshold VrG' were to be used. Using VrG' would not result in misreads of memory cells with threshold voltages on curve 229. However, as can be seen, there are a substantial number of memory cells under curve 231. Note that the y-axis may be on a log scale.

In an embodiment, error correction is utilized to adjust the read threshold and/or to handle some misreads. If the number of misreads is too high, then the data cannot be successfully read. For example, if the number of misreads is greater than the error correction ability of the controller 108, then the data cannot be accurately read. Also, some kinds of error correction can take a considerable amount of time to converge if there are too many misreads. Hence, the time to complete the read operation can be increased substantially, even if it is eventually successful.

By dynamically adjusting the read threshold to, for example, VrG", the data can be successfully read in at least some cases in which it would not be successfully read when using VrG'. Also, even if the data could have been successfully read when using VrG', the read process may be faster when reading at VrG" due to the error correction taking less time to converge.

Note that there still may be a small number of misreads when reading at VrG"; however, error correction coding should be able to correct these misreads. In this example, a misread occurs for memory cells on curve 231 with a threshold voltage lower than VrG". A misread occurs for memory cells on curve 229 with a threshold voltage higher than VrG". Note that due to the log scale, there may be relatively few memory cells at the intersection of curves 229 and 231.

In one embodiment, the read threshold is dynamically adjusted (e.g., using dynamic read threshold (DRT) or other techniques for identifying optimal read voltages) to minimize misreads. However, it is not required that misreads be minimized. In one embodiment, the read threshold is dynamically adjusted such that misreads are sufficiently low such that they may be corrected using ECC. In some cases, a relatively strong ECC may be available, in which case a higher number of misreads may be tolerable.

Note that there may be variations from one memory die to the next, which may lead to differences in threshold voltage distributions. Also, within a memory die there may be variations. For example, there could be differences from one block to the next. Also, there may be word line to word line variations within a block. One possible reason for these differences is that various interference effects may be different depending on the die, block, word line, etc. This may lead to differences in threshold distribution widths. Also, there may be differences in history of the data written to different blocks. For example, two blocks programmed at two different times, which have been resting for different periods of time, will show different amounts of threshold shift. Therefore, in general, the optimum read thresholds may differ based on die, block, word line, etc.

Read thresholds may be dynamically determined for any unit (die, block, word line, word line layer, level in a 3D array, etc.). Note that even for memory arrays that are freshly programmed, there may be differences between dies, blocks, word lines, etc., which may lead to differences between the threshold distributions. In other words, it may not be the case that one set of read thresholds are suitable for all dies, blocks, word lines, etc. Therefore, dynamically determining read thresholds may be used for freshly programmed memory. This may allow for optimizing read thresholds for dies, blocks, word lines, etc.

Figure 3:
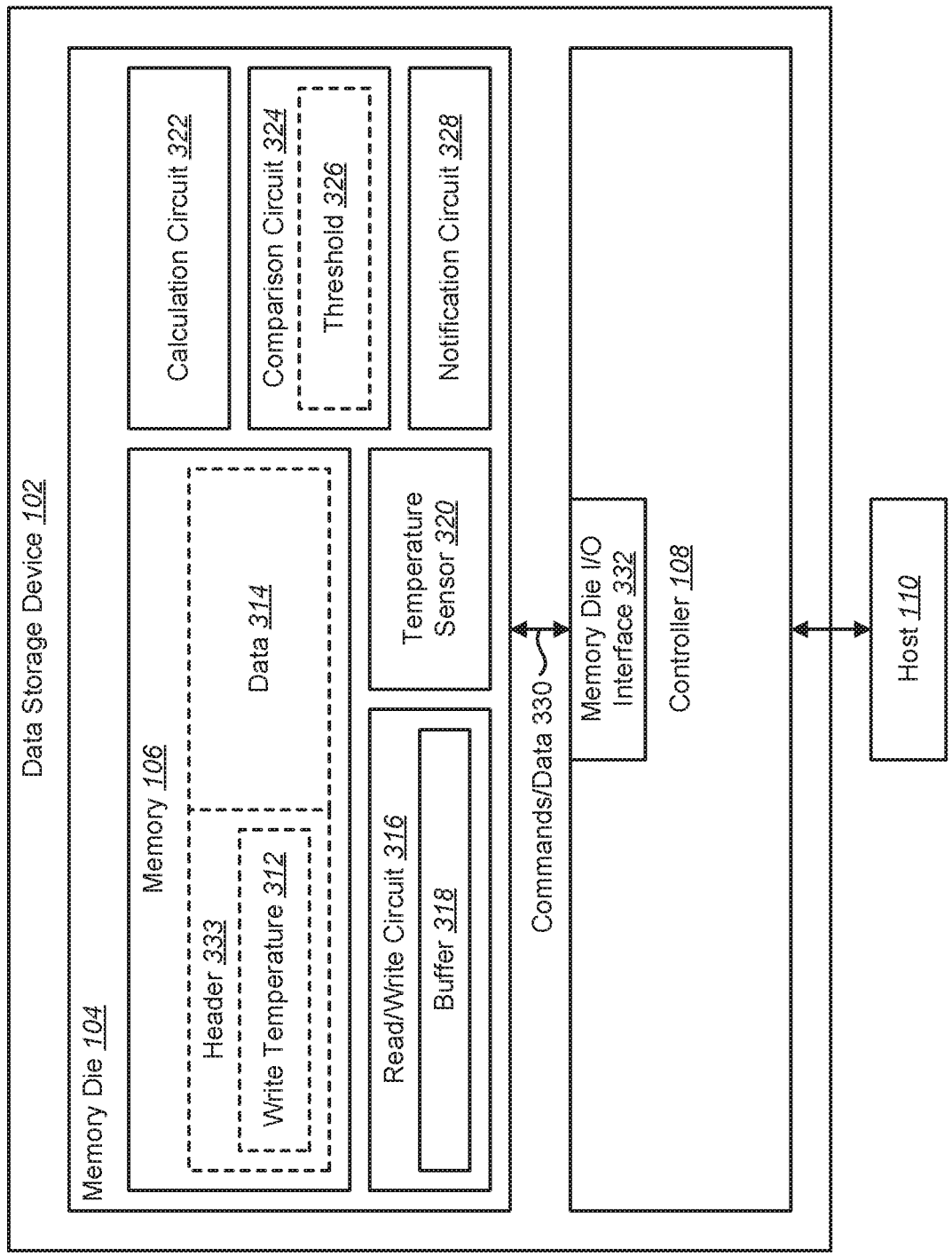
FIG. 3 is a block diagram illustrating a more specific example of a data storage device.

FIG. 3 is a block diagram illustrating one embodiment of a data storage device 102. As described in connection with FIG. 1, the data storage device 102 includes a memory die 104 and a controller 108.

The memory die 104 includes support circuitry, such as a read/write circuit 316, to support operation of one or more memory die 104. Although depicted as a single component, the read/write circuit 316 may be divided into separate components of the memory die 104, such as read circuitry and write circuitry. The memory die 104 includes a corresponding read/write circuit 316 that is operable to read data from and/or write data to the memory 106 (e.g., memory cells, registers, WLs, pages, and/or storage elements) within the individual memory die 104 independent of any other read and/or write operations at any other memory die(s).

In one embodiment, the controller 108 is coupled to and/or interfaces with a host 110. The controller 108 is coupled to and/or interfaces with the memory die 104. For example, the controller 108 is coupled to the memory die 104 via a bus, an interface (e.g., memory die input/output (I/O) interface 332), another structure, or a combination thereof. For example, the bus includes one or more channels to enable the controller 108 to communicate with a single memory die 104. In one embodiment, the controller 108 includes a memory die I/O interface 332 that interfaces with one or more memory die 104. As another example, the bus includes multiple distinct channels to enable the controller 108 to communicate with multiple memory die 104 in parallel with, and/or independently of, communication with other memory die 104. In one embodiment, the controller 108 includes multiple memory die I/O interfaces 332 that interface with multiple respective memory die 104.

The controller 108 is configured to receive data and instructions from the host 110 and to send data to the host 110. For example, the controller 108 sends data to the host 110 via a host interface (not shown), and the controller 108 receives data from the host 110 via the host interface.

The controller 108 is configured to send data and commands 330 to the memory die 104 and to receive data from the memory die 104. For example, the controller 108 is configured to send data and a write command 330 to cause the memory die 104 to store data to a specified address of the memory 106. In an embodiment, the controller 108 is also configured to send data and commands 330 to the memory 106 associated with background scanning operations, garbage collection operations, and/or wear leveling operations, etc., as illustrative, non-limiting examples. The controller 108 is configured to send a read request to the memory die 104 to access data from a specified address of the memory 106.

In one embodiment, the memory die 104 includes a temperature sensor 320. For example, the temperature sensor 320 measures a temperature and is configured to provide an indication of the measured temperature to the controller 108, such as a write temperature. For example, the temperature sensor 320 is responsive to one or more commands 330, such as a command to measure temperature. The memory die 104 includes a single temperature sensor 320, or includes multiple temperatures sensors. In an implementation with multiple memory die 104, each of the multiple memory die 104 includes a separate temperature sensor 320. Each of the temperature sensors 320 is independently polled by the controller 108 to provide a respective temperature for the associated memory die 104.

The memory 106 is illustrated as including representative data 314 (e.g., user data). For example, the data 314 includes encoded data, such as an ECC codeword, that is written to one or more word lines in one or more blocks of the memory 106. In one embodiment, the memory 106 stores a write temperature 312 associated with the data 314 in a header 333. For example, the write temperature 312 indicates a temperature measurement corresponding to the memory die 104 at a time the data 314 was programmed or written to the memory 106. For example, the write temperature 312 is determined concurrently with, prior to, or following programming of the data 314 to the memory 106. The write temperature 312 is stored in a block or word line as metadata in the block header or the word line header.

The memory die 104 (e.g., each memory die 104) includes a calculation circuit 322, a comparison circuit 324, and/or a notification circuit 328. The calculation circuit 322 is configured to determine a difference between a write temperature and a read temperature. For example, the calculation circuit 322 is implemented with logic circuitry (e.g., digital logic circuitry) configured to perform a subtraction between the write temperature and the read temperature. In one embodiment, the calculation circuit 322 is responsive to a read request for data 314 (e.g., user data) stored in the memory 106 to determine the difference between a write temperature 312 of the data 314 and a read temperature of the data 314.

A read request includes one or more instructions sent from the controller 108 to the memory die 104 to cause the memory die 104 to perform one or more operations related to reading data 314 from the memory 106. A read command is an instruction that causes the memory die 104 (e.g., read/write circuit 316) to read data 314 from the memory 106. A cross-temperature read command is an instruction that causes the memory die 104 to initiate a cross-temperature condition test corresponding to data 314. In one embodiment, the read request may include a read command and a separate cross-temperature read command. For example, the read request may include a read command and a separate cross-temperature read command. In another embodiment, the read request may include a single read command instructing the memory die 104 to both read the data 314 (e.g., user data) and initiate a cross-temperature condition test.

In some approaches, the write temperature 312 (and/or the data 314) is read by the read/write circuit 316 into a buffer 318 in response to a read request. The calculation circuit 322 determines (e.g., receives, reads, obtains, etc.) the write temperature 312 from the buffer 318 and determines (e.g., receives, reads, obtains, etc.) the read temperature from the temperature sensor 320. In one embodiment, the write temperature 312 and the data 314 (e.g., user data) is read into the buffer 318, and the write temperature 312 is provided to the calculation circuit 322. In one embodiment, the write temperature 312 is initially read into the buffer 318 without reading the data 314 (e.g., user data) into the buffer 318 and the write temperature 312 is provided to the calculation circuit 322.

In one embodiment, the calculation circuit 322 determines the difference between the write temperature 312 and the read temperature. The calculation circuit 322 is coupled to the comparison circuit 324. The difference is provided to the comparison circuit 324.

The comparison circuit 324 is configured to compare the difference to a threshold 326. For example, the comparison circuit 324 is implemented with logic circuitry (e.g., digital logic circuitry) configured to compare the difference to the threshold to determine whether the difference satisfies (e.g., is greater than, is greater than or equal to) the threshold. In one embodiment, the threshold 326 is received from the controller 108. For example, the controller 108 sends the threshold 326 to the memory die 104 using the memory die I/O interface 332. In one embodiment, the threshold 326 is a trim parameter provided by the controller 108. A trim parameter is a configurable parameter that can be set or adjusted to affect data storage device 102 behavior. For example, a trim parameter is entered by a device (e.g., host 110) or user during manufacturing, during calibration, or at another time. In one embodiment, the threshold 326 is received as a user input value. For example, the controller 108 receives a user input value (from the host 110, for instance) that specifies the threshold 326, which is sent to the memory die 104. In one embodiment, the comparison circuit 324 includes separate memory (e.g., registers) to store the threshold 326. Additionally or alternatively, the threshold 326 is stored in the memory 106.

The comparison circuit 324 determines whether the difference satisfies the threshold 326. An example of the threshold 326 is 65 degrees Celsius. Other values may be used for the threshold 326. For example, the threshold 326 may be a value between 10 and 100 degrees Celsius. In one embodiment, the threshold 326 is satisfied if the difference is greater than the threshold 326. In another embodiment, the threshold 326 is satisfied if the difference is greater than or equal to the threshold 326. Other conditions may be utilized to determine whether the threshold 326 is satisfied. The comparison circuit 324 produces an indicator that specifies whether the difference satisfies the threshold 326. For example, the comparison circuit 324 produces a bit, where a value of "0" indicates that the threshold is not satisfied (e.g., no cross-temperature condition) and a value of "1" indicates that the threshold is satisfied (e.g., a cross-temperature condition). The value is assigned differently in other examples (e.g., "1" indicates the threshold is not satisfied, "0" otherwise). The comparison circuit 324 is configured to determine whether the difference satisfies the threshold 326 before the data 314 (corresponding to a read request, for example) is sent to the controller 108. In one embodiment, the comparison circuit 324 is coupled to the notification circuit 328 and/or provides the indicator to the notification circuit 328.

The notification circuit 328 sends the indicator to the controller 108. For example, the notification circuit 328 sends the indicator to the controller 108 via the memory die I/O interface 332. For instance, in response to the difference satisfying the threshold 326, the notification circuit 328 signals a cross-temperature condition. In one embodiment, in response to the difference not satisfying the threshold 326 (where there is a non-cross-temperature condition), the data 314 is sent. In one embodiment, the notification circuit 328 signals a non-cross-temperature condition. For example, the notification circuit 328 sends an indicator as a bit, where one value specifies the cross-temperature condition and the other value specifies the non-cross-temperature condition.

In the case of a non-cross-temperature condition, the memory die 104 sends the data 314 corresponding to the read request to the controller 108. In one embodiment, in the case of a cross-temperature condition, the controller 108 sends a re-read request to the memory die 104. For example, the controller 108 initiates error correction by sending the re-read request. In response to the re-read request, the memory die 104 (e.g., read/write circuit 316) reads the data 314 (e.g., user data) using error correction. For example, the memory die 104 reads the data 314 using one or more adjusted read thresholds as described in connection with FIG. 2, where the controller 108 sends optimized read voltage sequences to the memory die 104.

In one embodiment, the memory die 104 performs the difference calculation, compares the difference to the threshold 326, and/or notifies the controller 108 whether there is a cross-temperature condition. Having the memory die 104 perform one or more of these operations (instead of the controller 108, for example) is beneficial by reducing and/or avoiding some signaling between the memory die 104 and the controller 108. For example, instead of sending data 314 to the controller 108 via the memory die I/O interface 332 only to have to re-read and re-send the data 314 in a cross-temperature condition, the cross-temperature condition can be determined locally on the memory die 104 and the data 314 can be re-read on the memory die 104 before sending the data 314 to the controller 108.

In one embodiment, the memory die 104 is configured to signal a cross-temperature condition in response to a read request instead of sending the data 314 from the memory 106. For example, upon receiving a read request, the memory die 104 determines whether a cross-temperature condition exists before sending data 314 corresponding to the read request to the controller 108. In some approaches, the notification circuit 328 is configured to signal the cross-temperature condition in response to the read request without the read/write circuit 316 sensing the data 314 (e.g., user data) stored in the memory 106. For example, upon receiving a read request, the write temperature 312 is read into the buffer 318 and provided to the calculation circuit 322 without reading the data 314 into the buffer 318. The data 314 is later read into the buffer 318 and sent to the controller 108 in response to determining a non-cross-temperature condition, or in response to receiving a read command for a cross-temperature condition. In other approaches, the write temperature 312 and the data 314 are read into the buffer 318 in response to a read request, and the write temperature 312 is provided to the calculation circuit 322. In response to a non-cross-temperature condition, the buffered data is sent (e.g., transmitted) to the controller 108. In response to a cross-temperature condition, the data 314 is re-read (using error correction, for instance) to the buffer 318 and sent to the controller 108.

In one embodiment, the memory die 104 includes a transfer circuit utilized to send data to the controller 108. For example, the transfer circuit is the read/write circuit 316 or is included in the read/write circuit 316. Additionally or alternatively, the memory die 104 includes a separate transfer circuit that is utilized as an interface circuit to send the data 314 to the controller 108. The data 314 is sent by the transfer circuit in response to determining that the difference does not satisfy the threshold 326 or in response to re-reading the data 314.

As can be observed, certain embodiments allow cross-temperature condition evaluation to be performed by the memory die 104 before sending data 314 to the controller 108. For example, this ensures that there is no toggling data out operation before determining whether there is a cross-temperature condition. This alleviates the signaling on the memory die I/O interface 332, which allows the data storage device 102 to operate more efficiently and/or at a higher speed. Certain embodiments also permit the memory die 104 (e.g., NAND) to make internal decisions regarding cross-temperature condition.

It should be noted that multiple elements illustrated in FIG. 3 may be combined in one embodiment. For example, the calculation circuit 322, the comparison circuit 324, and the notification circuit 328 are combined in some implementations. Additionally or alternatively, one or more elements illustrated in FIG. 3 are divided in some implementations. For example, the read/write circuit 316 is divided into multiple circuits, where each of the multiple circuits performs a subset of the operations of the read/write circuit 316.

Figure 4:
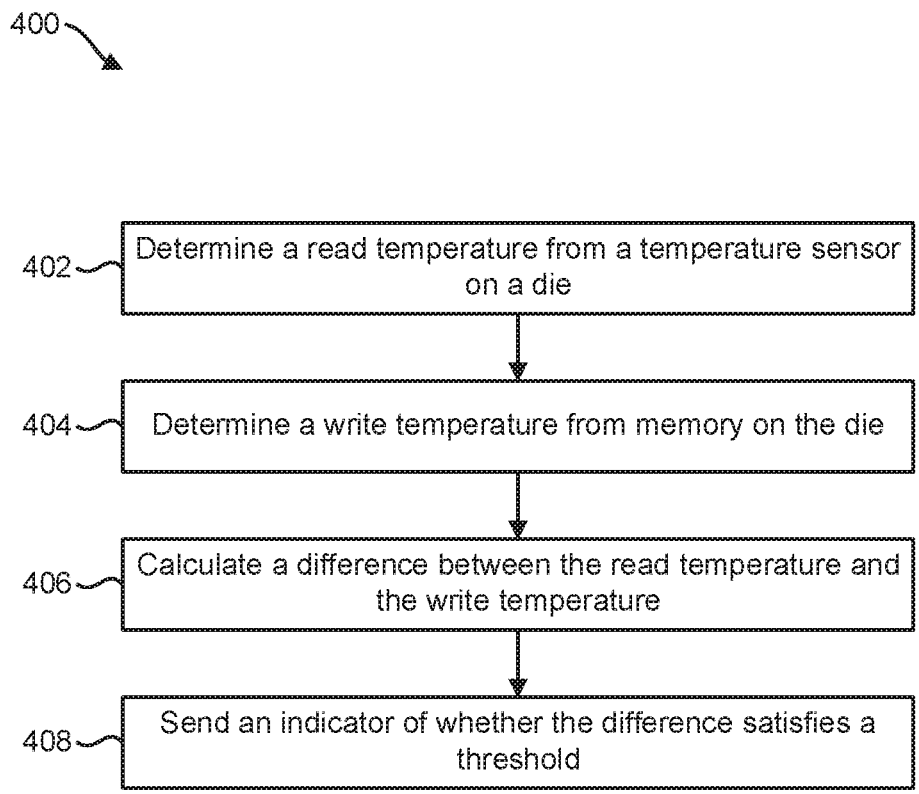
FIG. 4 is a flow diagram illustrating an example of a method of memory device signaling.

FIG. 4 is a flow diagram illustrating an example of a method 400 of memory device signaling. In one embodiment, a memory die performs the method. For example, the method 400 is performed by the memory die 104 of FIG. 3.

The memory die 104 determines 402 (e.g., reads, obtains) a read temperature from a temperature sensor 320 on the memory die 104. This is accomplished as described in connection with FIG. 3. For example, the calculation circuit 322 determines 402 a read temperature from the temperature sensor 320 in response to receiving a read request from the controller 108.

The memory die 104 determines 404 (e.g., reads, obtains) a write temperature 312 from memory 106 on the memory die 104. This is accomplished as described in connection with FIG. 3. For example, the calculation circuit 322 determines 404 a write temperature 312 stored in memory 106, where the write temperature 312 is associated with data 314 (e.g., user data) identified by the read request.

The memory die 104 calculates 406 a difference between the read temperature and the write temperature 312. This is accomplished as described in connection with FIG. 3. For example, the calculation circuit 322 calculates 406 the difference between the read temperature and the write temperature 312. The memory die 104 may defer transmission of the data 314 (e.g., user data) to the controller 108 until after calculating 406 the difference.

The memory die 104 sends 408 an indicator of whether the difference satisfies a threshold 326 to a controller 108. This is accomplished as described in connection with FIG. 3. For example, the comparison circuit 324 compares the difference to the threshold 326. The notification circuit 328 sends an indicator of whether the difference satisfies the threshold 326 in response to the difference satisfying the threshold 326. For instance, the notification circuit 328 signals a cross-temperature condition to the controller 108 in a case that the difference satisfies the threshold 326.

Figure 5:
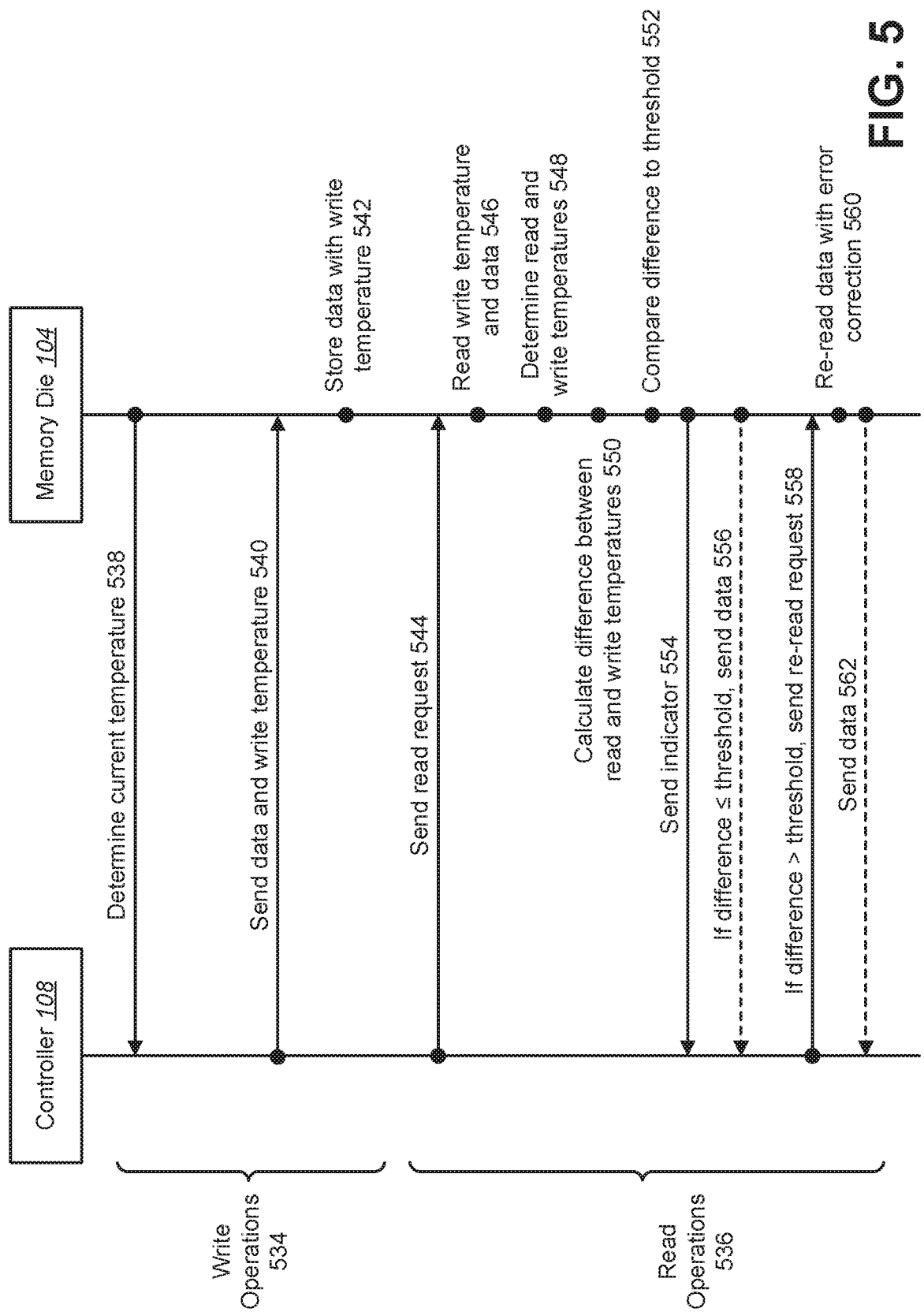
FIG. 5 is a thread diagram illustrating an example of a controller and a memory die.

FIG. 5 is a thread diagram illustrating an example of a controller 108 and a memory die 104. In particular, FIG. 5 illustrates examples of write operations 534 and read operations 536. When writing data, the controller 108 determines 538 a current temperature from the memory die 104. For example, the controller 108 sends a temperature read command (e.g., status read command) to the memory die 104 (e.g., NAND), and the memory die 104 responds by sensing the current temperature and sending the current temperature to the controller 108. The current temperature is the write temperature 312. The controller 108 updates the write temperature 312 in a page header for the data 314. The controller 108 sends 540 data 314 and the write temperature 312 to the memory die 104. The memory die 104 stores 542 (e.g., write or program) the data 314 with the write temperature 312 in memory 106.

When reading the data, the controller 108 sends 544 a read request. As described above, the read request may indicate or include a cross-temperature read command (e.g., a special status command for temperature comparison data). In response to the read request, the memory die 104 reads 546 the write temperature 312 and data 314. For example, the memory die 104 reads 546 the data 314 and the write temperature 312 into a buffer 318. Reading 546 the data 314 includes performing a page read operation without toggling data out (e.g., without sending the data to the controller 108).

The memory die 104 determines 548 a read temperature and the write temperature 312. For example, the calculation circuit 322 determines 548 the read temperature from a temperature sensor 320 and the write temperature 312 from the buffer 318.

The memory die 104 calculates 550 a difference between the read temperature and the write temperature 312. For example, the calculation circuit 322 takes the difference between the read temperature and the write temperature 312. The memory die 104 compares 552 the difference to a threshold 326. For example, the comparison circuit 324 determines whether the difference satisfies the threshold 326 or not.

The memory die 104 sends 554 an indicator to the controller 108. For example, the notification circuit 328 signals a bit that indicates a cross-temperature condition or not. In a case that the difference does not satisfy the threshold 326 (e.g., if the difference is less than or equal to the threshold 326), the memory die 104 sends 556 the data 314 to the controller 108. For example, if an indicator bit has a value of "1," the memory die 104 (e.g., buffer 318) toggles page data out.

In a case that the difference satisfies the threshold 326 (e.g., an indicator bit has a value of "0"), the controller 108 sends 558 a re-read request to the memory die 104. In one embodiment, the re-read request 558 commands the memory die 104 to apply error correction. For example, the controller 108 may predict a higher FBC and command error correction (e.g., DRT) for re-reading and toggling out the data 314. In response to the re-read request, the memory die 104 re-reads 560 the data 314 with error correction. For example, the memory die 104 apply adjusted read thresholds to re-read the data 314 with increased accuracy. The previously read data 314 is discarded from the buffer 318 and/or overwritten. The memory die 104 sends 562 the re-read data 314 to the controller 108.

Figure 6:
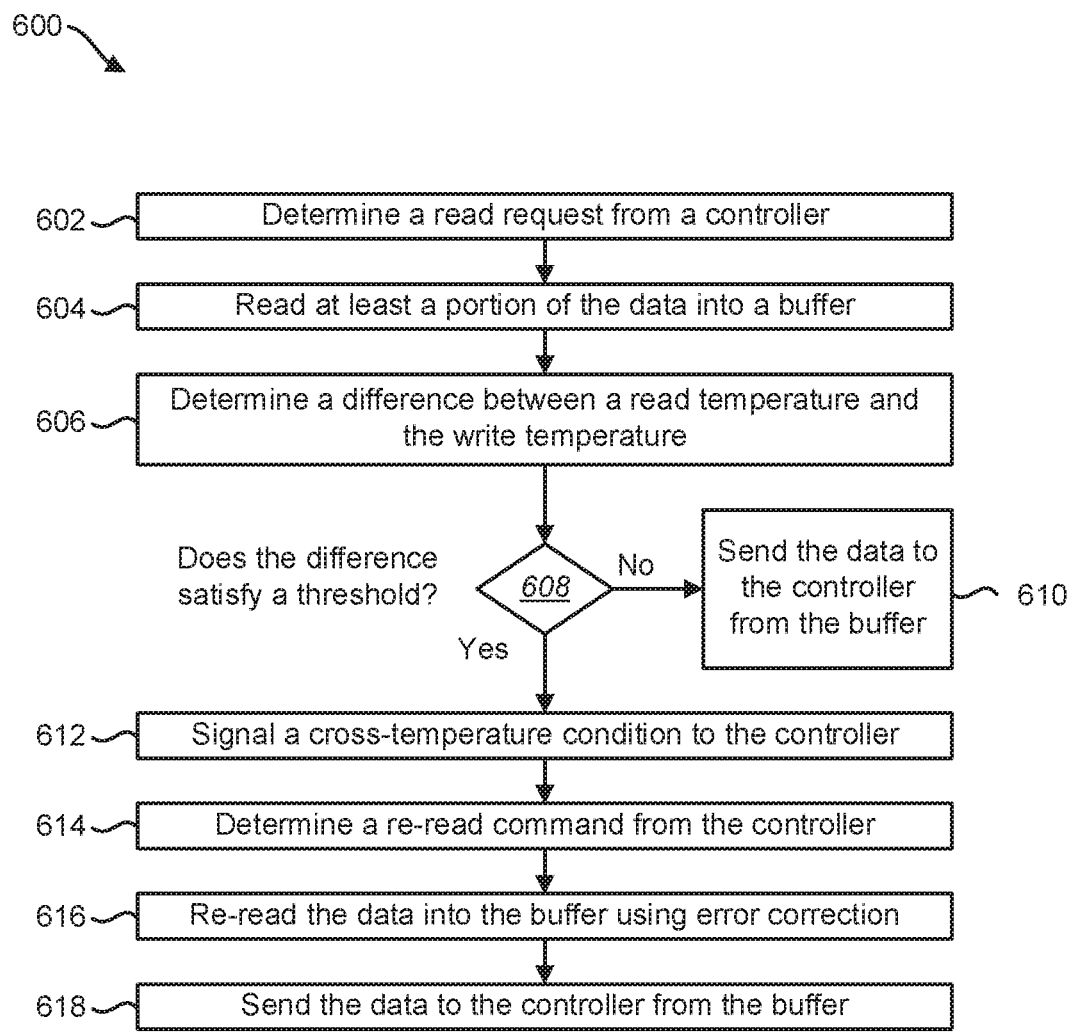
FIG. 6 is a flow diagram illustrating a more specific example of a method of memory device signaling.

FIG. 6 is a flow diagram illustrating a more specific example of a method 600 of memory device signaling. The method 600 is performed by a memory die. For example, the method 600 is performed by the memory die 104 of FIG. 3.

The memory die 104 determines 602 (e.g., receives) a read request from a controller 108. This is accomplished as described in connection with FIG. 3. For example, the memory die 104 receives a read command and a cross-temperature read command sent from the controller 108. In another example, the memory die 104 receives a read request that instructs the memory die 104 to read data (e.g., write temperature 312 and user data 314) from the memory 106 and initiate a cross-temperature condition test.

The memory die 104 reads 604 at least a portion of the data into a buffer 318. This is accomplished as described in connection with FIG. 3. For example, the memory die 104 reads the write temperature 312 and/or user data into the buffer 318. The write temperature 312 is stored in a header associated with user data in the memory 106. In one embodiment, the memory die 104 accesses a subset of the data in the buffer 318 that specifies the write temperature 312. For example, the calculation circuit 322 accesses only part of the buffered data to determine the write temperature 312.

The memory die 104 determines 606 a difference between a read temperature and the write temperature 312. This is accomplished as described in connection with FIG. 3. For example, the calculation circuit 322 determines 606 the difference between a read temperature from the temperature sensor 320 and the write temperature 312 from the buffer 318.

The memory die 104 determines 608 whether the difference satisfies a threshold 326. This is accomplished as described in connection with FIG. 3. For example, the comparison circuit 324 compares the difference to the threshold 326 to determine 608 whether the difference satisfies the threshold 326. The determination 608 is performed in response to the read request. In one embodiment, the memory die 104 signals the determination 608 to the controller 108 (e.g., signal a cross-temperature condition or not).

In a case that the difference does not satisfy the threshold 326, the memory die 104 sends 610 the data to the controller 108 from the buffer 318. This is accomplished as described in connection with FIG. 3. For example, the memory die 104 sends 610 the data (e.g., toggle out the data) to the controller 108 via a memory die I/O interface 332. Sending 610 the data may include sequentially providing subsets (e.g., bytes) of the data to the controller 108.

In a case that the difference satisfies the threshold, the memory die 104 signals 612 a cross-temperature condition to the controller 108. This is accomplished as described in connection with FIG. 3. For example, the notification circuit 328 sends a bit with a value indicating the cross-temperature condition (e.g., that the difference satisfies the threshold 326).

The memory die 104 determines 614 (e.g., receives) a re-read command from the controller 108. This is accomplished as described in connection with FIG. 3. For example, the memory die 104 determines 614 (e.g., receives) a command to re-read the data using error correction.

The memory die 104 re-reads 616 the data into the buffer 318 using error correction. This is accomplished as described in connection with FIG. 3. For example, the read/write circuit 316 re-reads the data into the buffer 318 using error correction (e.g., adjusted read thresholds).

The memory die 104 sends 618 the data to the controller 108 from the buffer 318. This is accomplished as described in connection with FIG. 3. For example, the memory die 104 sends 618 (e.g., toggle out) the re-read data to the controller 108.

Figure 7:
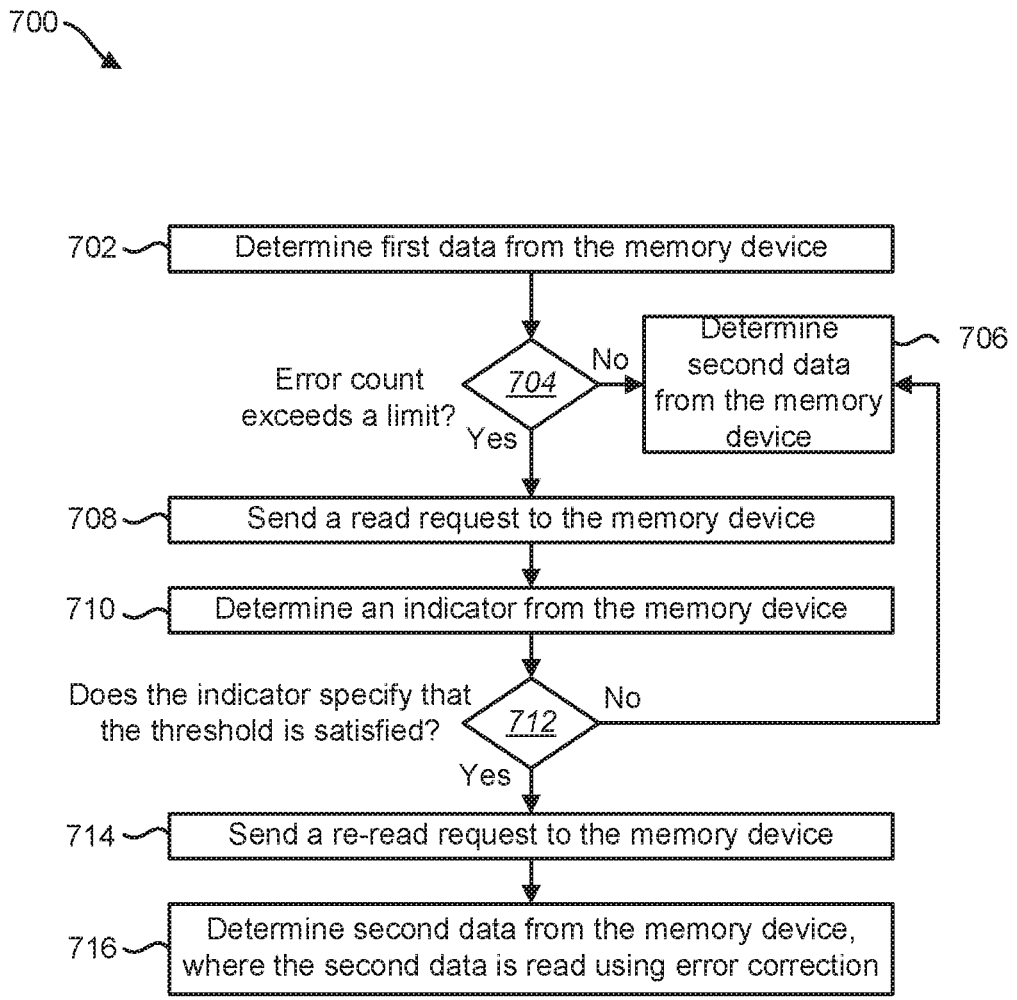
FIG. 7 is a flow diagram illustrating another example of a method of memory device signaling.

FIG. 7 is a flow diagram illustrating another example of a method 700 of memory device signaling. The method 700 is performed by a controller. For example, the method 700 is performed by the controller 108 of FIG. 3.

The controller 108 determines 702 (e.g., receives) first data from the memory device. For example, the controller 108 sends a read request for the first data to the memory device and determines 702 (e.g., receives) the first data corresponding to the read request. The memory die 104 described in connection with FIG. 3 is an example of the memory device.

The controller 108 determines 704 whether an error count exceeds a limit. For example, the controller 108 performs error checking on the determined first data. The error checking is performed using an error checking code or error correction code of the first data. The controller 108 counts a number of erroneous bits detected to determine an error count. The controller 108 compares the error count to a limit to determine 704 whether the error count exceeds the limit. In one embodiment, the limit is lower than a number of bits that are correctable using an error correction code. The limit is a FBC limit in one embodiment.

In a case that the error count does not exceed the limit, the controller 108 determines 706 (e.g., receives) second data from the memory device. For example, the controller 108 requests and receives second data corresponding to a second read request.

In a case that the error count exceeds a limit, the controller 108 sends 708 a read request from a memory device. This is accomplished as described in connection with FIG. 3. For example, the controller 108 sends a read command and a cross-temperature read command to the memory device. In another example, the controller 108 sends a read request that instructs the memory device to read data (e.g., write temperature 312 and user data 314) from the memory 106 and initiates a cross-temperature condition test.

The controller 108 determines 710 (e.g., receives) an indicator from the memory device. This is accomplished as described in connection with FIG. 3. For example, the controller 108 determines 710 (e.g., receives) a bit that indicates whether a threshold 326 is satisfied (e.g., whether a cross-temperature condition exists or not).

The controller 108 determines 712 whether the indicator specifies that the threshold 326 is satisfied. This is accomplished as described in connection with FIG. 3. For example, the controller 108 determines the value of a bit that indicates whether a threshold 326 is satisfied (e.g., whether a cross-temperature condition exists or not). In a case that the indicator specifies that the threshold 326 is not satisfied (e.g., that a cross-temperature condition does not exist), the controller 108 determines 706 (e.g., receives) second data from the memory device corresponding to the sent 708 read request.

In a case that the indicator specifies that the threshold 326 is satisfied, the controller 108 sends 714 a re-read request to the memory device. This is accomplished as described in connection with FIG. 3. For example, the controller 108 sends 714 a command to re-read the data using error correction. In one embodiment, the controller 108 initiates and/or provides information for performing error correction. For example, the controller 108 sends read voltage sequences (e.g., optimal read voltage thresholds) to the memory device. Accordingly, the controller 108 adjusts one or more read temperature thresholds for the memory device to read the data.

The controller 108 determines 716 (e.g., receives) second data from the memory device, where the second data is read using error correction. This is accomplished as described in connection with FIG. 3. For example, the controller 108 determines the second data from a buffer, where the second data has been re-read by the memory device using error correction. In various configurations, determining (e.g., receiving) data from the memory device includes sequentially receiving subsets (e.g., bytes) of the data from the memory device.

Figure 8:
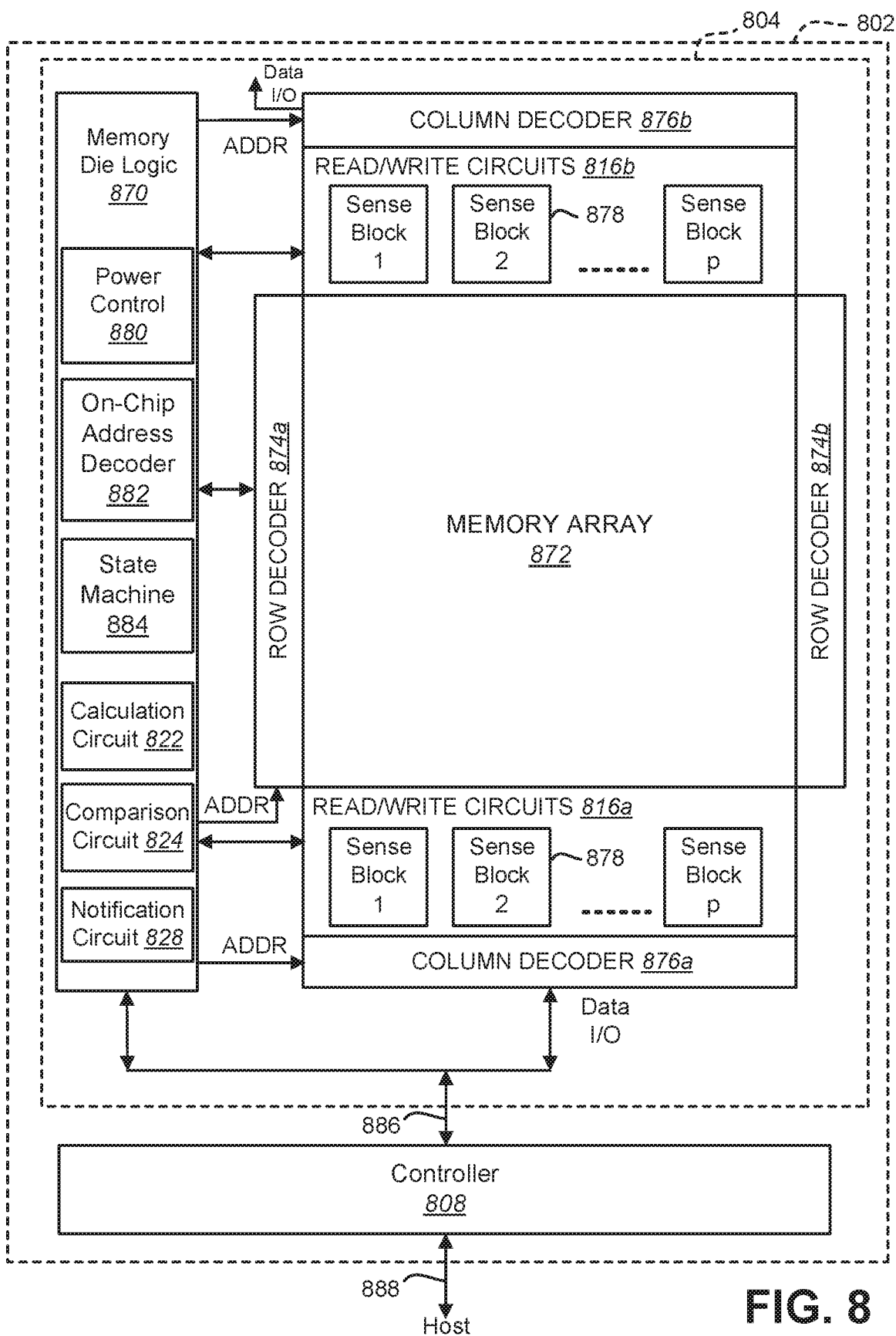
FIG. 8 illustrates an example of a data storage device having read/write circuits.

FIG. 8 illustrates an example of a data storage device 802 having read/write circuits. The read/write circuits are utilized for reading and programming memory cells (e.g., NAND multi-state flash memory or other types of non-volatile memory). The data storage device 802 is an example of the data storage device 102 described in connection with one or more of FIG. 1 and FIG. 3, where one or more corresponding elements or blocks of the data storage device 802 may operate as described in connection with one or more of FIG. 1 and FIG. 3. For example, the array 872 of memory cells is an example of the memory 106 described in connection with FIG. 3.

In an embodiment, the data storage device 802 includes one or more memory die or chips 804. The memory die 804 includes an array 872 (two-dimensional or three-dimensional) of memory cells, memory die logic 870, and read/write circuits 816a, 816b. In one embodiment, access to the array 872 by the various peripheral circuits is implemented in a symmetric fashion, on opposite sides of the array 872, so that the densities of access lines and circuitry on each side are reduced by half. In one embodiment, the read/write circuits 816a, 816b include multiple sense blocks 878 which allow a page (or other unit) of memory cells to be read or programmed in parallel. The array 872 is addressable by word lines via row decoders 874a and 874b and by bit lines via column decoders 876a, 876b. Word lines and bit lines are examples of control lines. In a typical embodiment, a controller 808 is included in the same data storage device 802 (e.g., a removable storage card or package) as the one or more memory die 804. Commands and data are transferred between the host and controller 808 via one or more lines 888 and between the controller 808 and the one or more memory die 804 via one or more lines 886.

The memory die logic 870 cooperates with the read/write circuits 816a, 816b to perform memory operations on the array 872 of memory cells. The memory die logic 870 includes a state machine 884, an on-chip address decoder 882, a power control module 880, a calculation circuit 822, a comparison circuit 824, and a notification circuit 828. In one embodiment, the calculation circuit 822, comparison circuit 824, and/or notification circuit 828 are included in and/or coupled to the state machine 884. The state machine 884 provides chip-level (e.g., die-level) control of memory operations. The on-chip address decoder 882 provides an address interface between that used by the host or a memory controller to the hardware address used by the decoders 874a, 874b, 876a, 876b. The power control module 880 controls the power and voltages supplied to the word lines and bit lines during memory operations. In one embodiment, the power control module 880 includes one or more charge pumps that can create voltages larger than the supply voltage.

In one embodiment, one or any combination of the memory die logic 870, the power control module 880, the on-chip address decoder 882, the state machine 884, the calculation circuit 822, the comparison circuit 824, the notification circuit 828, the column decoders 876a, 876b, the row decoders 874a, 874b, the read/write circuits 816a, 816b, and/or the controller 808 can be referred to as one or more managing or die-level control circuits. The one or more managing or die-level control circuits may perform the processes described herein.

In particular, the calculation circuit 822 described in connection with FIG. 8 may perform one or more of the operations described in connection with the calculation circuit 322 described in connection with FIG. 3. Additionally or alternatively, the comparison circuit 824 described in connection with FIG. 8 may perform one or more of the operations described in connection with the comparison circuit 324 described in connection with FIG. 3. Additionally or alternatively, the notification circuit 828 described in connection with FIG. 8 may perform one or more of the operations described in connection with the notification circuit 328 described in connection with FIG. 3. Additionally or alternatively, the read/write circuits 816a-b described in connection with FIG. 8 may perform one or more of the operations described in connection with the read/write circuit 316 described in connection with FIG. 3.

Figure 9:
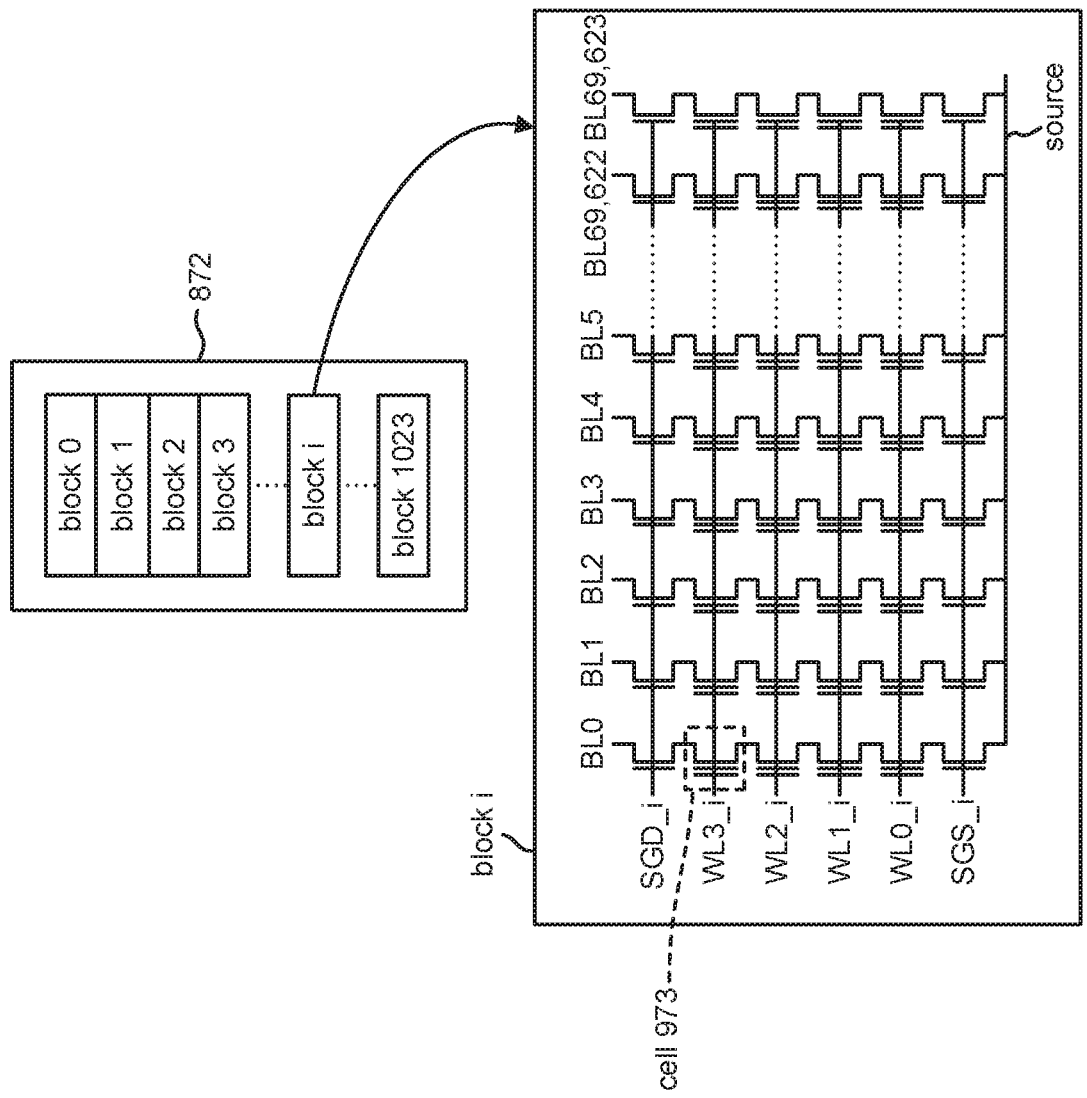
FIG. 9 depicts an exemplary structure of memory cell array.

FIG. 9 depicts an exemplary structure of an array 872 of memory cells. The array 872 includes a plurality of memory cells, where an example of a memory cell 973 is shown. In one embodiment, the array of memory cells is divided into a large number of blocks (e.g., blocks 0-1023, or another amount) of memory cells. As is common for flash EEPROM systems, the block is the unit of erase. That is, each block contains the minimum number of memory cells that are erased together. Other units of erase can also be used.

A block contains a set of NAND strings which are accessed via bit lines (e.g., bit lines BL0-BL69, 623) and word lines (WL0, WL1, WL2, WL3). FIG. 9 shows four memory cells connected in series to form a NAND string. Although four cells are depicted to be included in each NAND string, more or less than four can be used (e.g., 16, 32, 64, 128 or another number or memory cells can be on a NAND string). One terminal of the NAND string is connected to a corresponding bit line via a drain select gate (connected to select gate drain line SGD), and another terminal is connected to the source line via a source select gate (connected to select gate source line SGS).

Each block is typically divided into a number of pages. In one embodiment, a page is a unit of programming. Other units of programming can also be used. One or more pages of data are typically stored in one row of memory cells. For example, one or more pages of data are stored in memory cells connected to a common word line. A page can store one or more sectors. A sector includes user data and overhead data (also called system data). Overhead data typically includes header information and error correction codes (ECC) that have been calculated from the user data of the sector. The controller (or other component) calculates the ECC when data is being programmed into the array, and also checks the data when the data is being read from the array. Different sized blocks, pages, and sectors can also be used.

Figure 10:
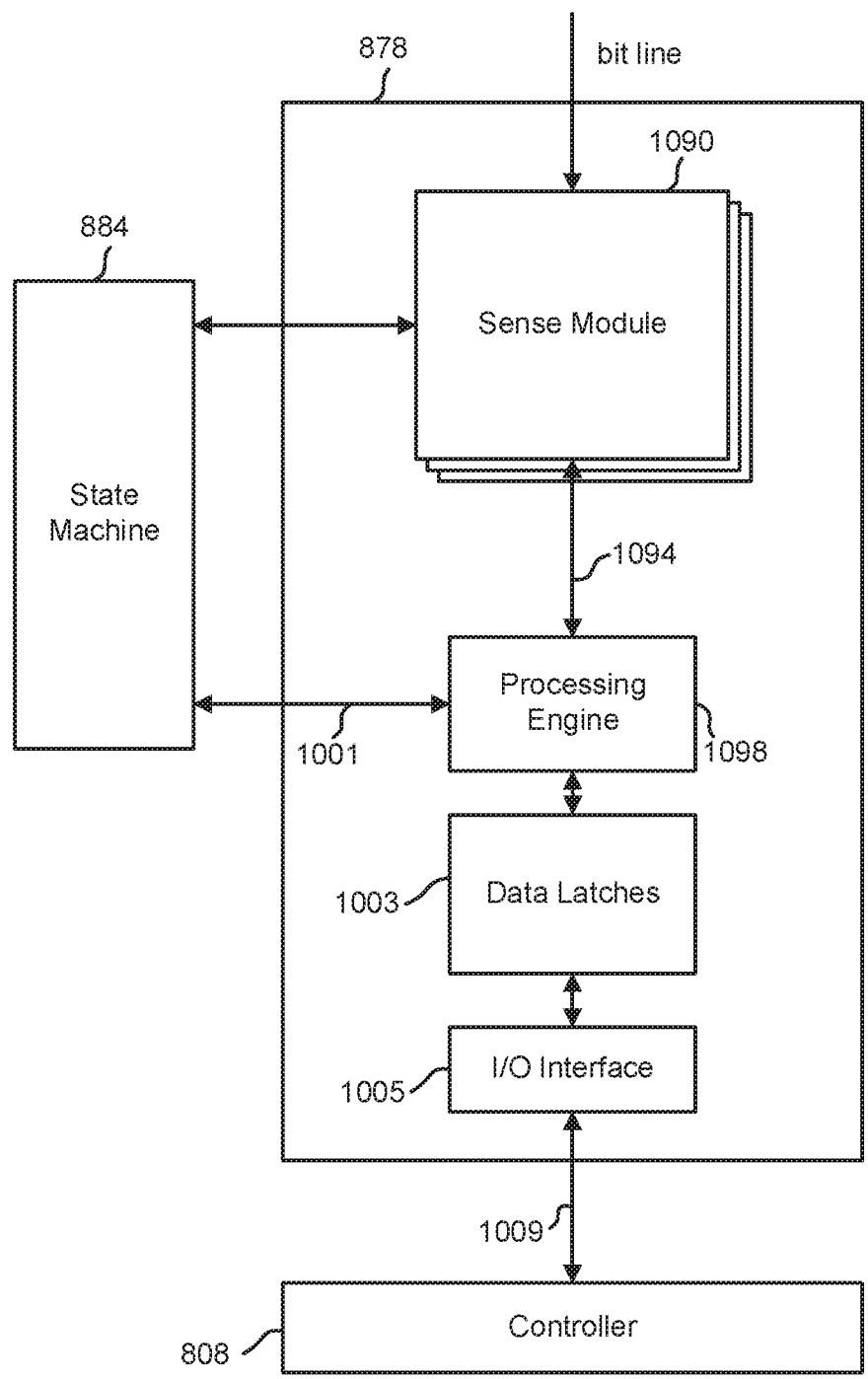
FIG. 10 is a block diagram of a sense block.

FIG. 10 is a block diagram of a sense block 878. In one embodiment, the sense block 878 includes one or more sense modules 1090, a processing engine 1098, data latches 1003, and an input/output (I/O) interface 1005. In one embodiment, there will be a separate sense module 1090 for each bit line and a processing engine 1098, a set of data latches 1003, and I/O interface 1005 for a set of multiple sense modules 1090. In one example, a sense block 878 will include a processing engine 1098, a set of data latches 1003, an I/O interface 1005, and eight sense modules 1090. Each of the sense modules 1090 in a group will communicate with the processing engine 1098 via a data bus 1094. One example can be found in United States Patent Application Pub. No. 2006/0140007, entitled "Non-Volatile Memory and Method Which Shared Processing for an Aggregate of Read/Write Circuits," published on Jun. 29, 2006, which is incorporated herein by reference in its entirety.

In an embodiment, the sense module 1090 comprises sense circuitry (not shown in FIG. 10) that determines whether a conduction current in a connected bit line is above or below a predetermined level. The sense module 1090 includes a circuit referred to as a sense amplifier. The sense module 1090 also includes a bit line latch (not shown in FIG. 10) that is used to set a voltage condition on the connected bit line. For example, a predetermined state latched in the bit line latch will result in the connected bit line being pulled to a state designating program inhibit (e.g., Vdd).

In an embodiment, the set of data latches 1003 is coupled to the processing engine 1098, and the I/O interface 1005 is coupled between the set of data latches 1003 and a data bus 1009. The set of data latches 1003 includes one or more data latches (e.g., a stack of data latches). Examples of data latches include a transfer data latch (XDL), a first data latch (ADL), a second data latch (BDL), etc. It should be noted that more or fewer data latches may be implemented. The set of data latches 1003 is an example of the buffer 318 or a subset of the buffer 318 described in connection with FIG. 3. The processing engine 1098 performs computations. For example, one of the functions of the processing engine 1098 is to determine the data stored in the sensed memory cell and store the determined data in the set of data latches 1003. In one embodiment, the processing engine 1098 may perform a read operation using error correction. For example, the processing engine 1098 may perform error correction (e.g., DRT) in response to one or more commands from a separate controller 808 (via a state machine 884, for instance) when re-reading data from memory cells. The set of data latches 1003 is used to store data bits determined by the processing engine 1098 during a read operation. The set of data latches 1003 may also be used to store data bits imported from the data bus 1009 during a program or write operation. The imported data bits represent write data meant to be programmed into the memory. An I/O interface 1005 provides an interface between data latches 1003 and the data bus 1009.

During read or sensing, the state machine 884 controls (using the power control module 880) the supply of different control gate voltages to the addressed memory cell(s). As the state machine 884 steps through the various predefined control gate voltages corresponding to the various memory states supported by the memory, the sense module 1090 may trip at one of these voltages and an output will be provided from the sense module 1090 to the processing engine 1098 via the bus 1094. At that point, the processing engine 1098 determines the resultant memory state by consideration of the tripping event(s) of the sense module 1090 and the information about the applied control gate voltage from the state machine via the input line(s) 1001. The processing engine 1098 then computes a binary encoding for the memory state and stores the resultant data bits into the data latches 1003. In another embodiment of the core portion, the bit line latch serves double duty, both as a latch for latching the output of the sense module 1090 and also as a bit line latch as described above.

In one embodiment, the data latches 1003 include a stack of data latches corresponding to the sense module 1090. In one embodiment, there are three (or four or another number) data latches per sense module 1090. In one embodiment, the latches are each one bit. The data latches 1003 may comprise, in one embodiment, a stack of data latches that may be referred to as the XDL, ADL, and BDL. Typically, data read from a memory cell or data to be programmed into a memory cell will first be stored in the XDL. In case the data is to be programmed into a memory cell, the system can program the data into the memory cell from the XDL. In one embodiment, the data is programmed into the memory cell entirely from the XDL before the next operation proceeds. In an alternative embodiment (more details below), as the system begins to program a memory cell through the XDL, the system also transfers the data stored in the XDL into the ADL in order to reset the XDL. Before data is transferred from the XDL into the ADL, the data kept in the ADL is transferred to the BDL, flushing out whatever data (if any) is being kept in the BDL. Once data has been transferred from the XDL into the ADL, the system continues (if necessary) to program the memory cell through the ADL, while simultaneously loading the data to be programmed into a memory cell on the next word line into the XDL, which has been reset. By performing the data load and programming operations simultaneously, the system can save time and thus perform a sequence of such operations faster. In some cases, data can be transferred directly from the XDL to the BDL, bypassing the ADL. In some cases, data read from a memory cell can be stored directly into the ADL, bypassing the XDL.

In one embodiment, the XDL, ADL, and BDL latches can be used to preserve data in case a fault, such as a word line to word line short circuit, is discovered during the programming process. If such a fault is discovered, then the system can program the data stored in the latches in another block of memory cells. In one embodiment, the system programs the data stored in the XDL, ADL (after transferring the data stored therein into XDL), and BDL (after transferring the data stored therein into the XDL), in that order, into the new block of memory cells. In one embodiment, the system has each of the XDL, ADL, and BDL for each physical plane of the memory die.

During program or verify, the data to be programmed is stored in the set of data latches 1003 from the data bus 1009. During the verify process, the processing engine 1098 monitors the verified memory state relative to the desired memory state. When the two are in agreement, the processing engine 1098 sets the bit line latch so as to cause the bit line to be pulled to a state designating program inhibit. This inhibits the memory cell coupled to the bit line from further programming even if the memory cell is subjected to programming pulses on the memory cell's control gate. In another embodiment, the processing engine 1098 initially loads the bit line latch and the sense circuitry sets the bit line latch to an inhibit value during the verify process.

In one embodiment (but not required), the data latches 1003 are implemented as a shift register so that the parallel data stored therein is converted to serial data for data bus 1009, and vice versa. In one embodiment, all the data latches corresponding to the read/write block of m memory cells can be linked together to form a block shift register so that a block of data can be input or output by serial transfer. In particular, the bank of read/write modules is adapted so that each of its set of data latches will shift data in to or out of the data bus 1009 in sequence as if they are part of a shift register for the entire read/write block.

Additional information about the sensing operations and sense amplifiers can be found in (1) United States Patent Application Pub. No. 2004/0057287, entitled "Non-Volatile Memory and Method With Reduced Source Line Bias Errors," published on Mar. 25, 2004; (2) United States Patent Application Pub No. 2004/0109357, entitled "Non-Volatile Memory and Method with Improved Sensing," published on Jun. 10, 2004; (3) U.S. Patent Application Pub. No. 2005/0169082, "Memory Sensing Circuit And Method for Low-Voltage Operation," published on Aug. 4, 2005; (4) U.S. Patent Publication 2006/0221692, entitled "Compensating for Coupling During Read Operations of Non-Volatile Memory," published on Oct. 5, 2006; and (5) United States Patent Application Pub. No. 2006/0158947, "Reference Sense Amplifier for Non-Volatile Memory," published on Jul. 20, 2006. All five of the immediately above-listed patent documents are incorporated herein by reference in their entirety.

At the end of a successful programming process (with verification), the threshold voltages of the memory cells are within one or more distributions of threshold voltages for programmed memory cells or within a distribution of threshold voltages for erased memory cells, as appropriate.

Figure 11:
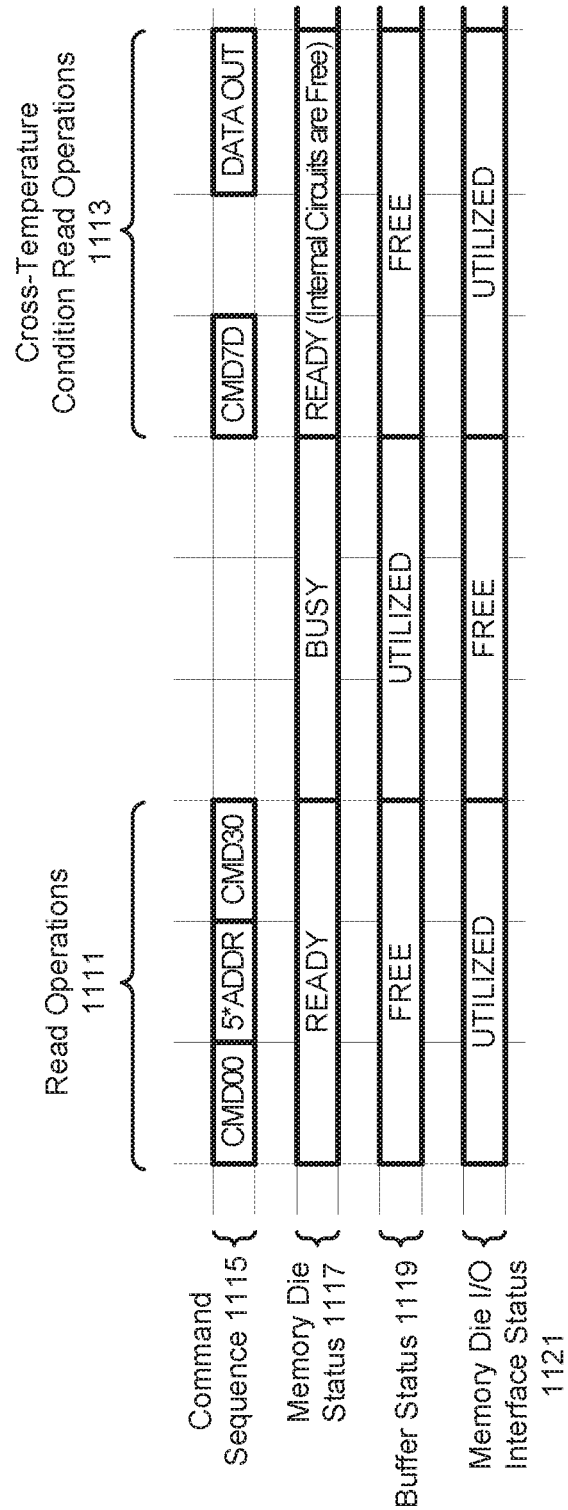
FIG. 11 is a timing diagram.

FIG. 11 is a timing diagram. In particular, FIG. 11 illustrates an example of cross-temperature condition read operations 1113. In this example, the read operations 1111 illustrate a command (CMD) sequence 1115 for reading data from memory. As illustrated, the read operations 1111 may include a CMD00 command, an address (5*ADDR), and a CMD30 command, which is an example of commands for a NAND flash memory read operation. Other commands may be utilized to initiate a read operation. The address specifies the location of the requested data in the memory. When the commands of the read operations 1111 are issued, the memory die status 1117 is ready and the buffer status 1119 (e.g., XDL status) is free. The buffer status 1119 indicates the status of the buffer 318 described in connection with FIG. 3. The memory die I/O interface status 1121 indicates a status of the memory die I/O interface 332 described in connection with FIG. 3. The memory die I/O interface 332 is utilized while the commands are being sent from the controller 108 to the memory die 104 over the memory die I/O interface 332.

In response to the commands of the read operations 1111, the memory die status becomes busy while the data is read to the buffer 318. The memory die I/O interface status 1121 is free during this time, because no data is being sent to the controller 108 over the memory die I/O interface 332.

The cross-temperature condition read operations 1113 provide examples of operations that are carried out in a potential cross-temperature condition scenario. In particular, the controller 108 sends a cross-temperature read command (such as CMD7D) over the memory die I/O interface 332, which commands the memory die 104 to compare read and write temperatures 312. The memory die 104 notifies the controller 108 whether there is a cross-temperature condition over the memory die I/O interface 332. In some cases, the controller 108 sends a re-read command to the memory die 104. The data is sent to the controller 108 over the memory die I/O interface 332 if there is not a cross-temperature condition. Or, the data is re-read by the memory die 104 and sent to the controller 108 in the case of a cross-temperature condition.

One embodiment of a die disclosed herein includes a plurality of memory cells. The die also includes a calculation circuit configured to determine a difference between a write temperature and a read temperature in response to a read request for user data stored in the memory cells. The die further includes a notification circuit configured to signal a cross-temperature condition in response to the difference satisfying a threshold. The notification circuit may notify a memory controller of the cross-temperature condition. The read request may include a read command and a cross-temperature read command. Alternatively, the read request includes a single read command configured to read the user data from the memory and to initiate a cross-temperature condition test. The die is also configured to determine a read temperature from a temperature sensor on the die. The die is also, in one embodiment, configured to determine the write temperature from memory on the die, the write temperature being associated with user data identified by the read request. The die may also be configured to signal the cross-temperature condition in response to the read request instead of sending the user data from the memory cells. The die includes a read circuit configured to read data stored in the memory cells in response to the read request. The notification circuit, in one embodiment, is configured to signal the cross-temperature condition in response to the read request without the read circuit sensing user data stored in the memory cells. The calculation circuit may be configured to determine the write temperature for data identified in the read request, the write temperature being determined from the memory cells, and to determine the read temperature from a sensor on the die. In one embodiment, a memory controller is coupled to the die and to each of a plurality of die, and each of the plurality of die includes a calculation circuit.

The die, in one embodiment, is configured to receive a re-read request in response to signaling that the difference satisfies the threshold. The die may be configured to defer transmission of the user data to the controller until after calculating the difference. The die may also be configured to receive the threshold from the controller.

An embodiment of a non-volatile storage system is also described. The non-volatile storage system includes a memory die. The memory die includes a plurality of memory cells. The memory die also includes a read circuit configured to read data stored in the memory cells in response to a read command. The memory die further includes a calculation circuit configured to calculate a difference between a write temperature and a read temperature for the data in response to a cross-temperature read command. The memory die additionally includes a notification circuit configured to signal whether the difference satisfies a threshold to a controller. The memory die also includes a transfer circuit configured to send the data to the controller in response to determining that the difference does not satisfy the threshold. The controller is configured to initiate error correction to read the data in response to a signal indicating that the difference satisfies the threshold. The controller may be configured to determine that an error count exceeds a limit. The controller, in one embodiment, is configured to send a read command and a cross-temperature read command to the memory die in response to determining that the error count exceeds the limit.

An embodiment of a method is also described. The method includes receiving, by a memory device, a read request from a controller to read data stored on the memory device. The method also includes reading, by the memory device, at least a portion of the data into a buffer on the memory device in response to the read request. The method further includes determining, by the memory device, whether a difference between a read temperature and a write temperature for the data satisfies a threshold in response to the read request. The method additionally includes signaling, by the memory device, the determination to the controller. In one embodiment, the method includes accessing, by the memory device, a subset of the data in the buffer that specifies the write temperature.

An embodiment of an apparatus is also described. The apparatus includes a controller and a memory die. The memory die includes means for storing user data. The memory die also includes means for receiving a request for the user data from a controller. The memory die further includes means for calculating a difference between a write temperature and a read temperature for the user data, the write temperature associated with the user data identified by the request. The memory die additionally includes means for comparing the difference to a threshold. The memory die also includes means for signaling whether the difference satisfies the threshold to the controller.

A means for storing data disclosed herein may include a memory die 104, memory 106, read/write circuit 316, read/write circuit 816, sense block 878, array 872 of memory cells, blocks of memory cells, memory die logic 870, state machine 884, and/or other hardware. Other embodiments may include similar or equivalent means for storing data.

A means for receiving a request for data from a controller, in one embodiment, may include a memory die 104, read/write circuit 316, memory die logic 870, state machine 884, on-chip address decoder 882, calculation circuit 322, calculation circuit 822, comparison circuit 324, comparison circuit 824, notification circuit 328, notification circuit 828, and/or other hardware. Other embodiments may include similar or equivalent means for receiving a request for data from a controller.

A means for calculating a difference between a write temperature and a read temperature for the data, in one embodiment, may include a memory die 104, calculation circuit 322, calculation circuit 822, memory die logic 870, and/or other hardware. Other embodiments may include similar or equivalent means for calculating a difference.

A means for comparing the difference to a threshold, in one embodiment, may include a memory die 104, comparison circuit 324, comparison circuit 824, memory die logic 870, and/or other hardware. Other embodiments may include similar or equivalent means for comparing the difference.

A means for signaling whether the difference satisfies the threshold to the controller, in one embodiment, may include a memory die 104, notification circuit 328, notification circuit 828, memory die logic 870, and/or other hardware. Other embodiments may include similar or equivalent means for signaling whether the difference satisfies the threshold.

A means for deferring transmission of the data from the memory die to the controller until after the difference is compared to the threshold, in one embodiment, may include a memory die 104, read/write circuit 316, read/write circuit 816, buffer 318, memory die logic 870, state machine 884, sense block 878, row decoder 874, column decoder 876, and/or other hardware. Other embodiments may include similar or equivalent means for deferring transmission of the data.

As used in this application, the terms "an embodiment," "one embodiment," "another embodiment," or analogous language do not refer to a single variation of the disclosed subject matter; instead, this language refers to variations of the disclosed subject matter that may be applied and used with a number of different implementations of the disclosed subject matter.

One of skill in the art will recognize that this disclosure is not limited to the two-dimensional and three-dimensional exemplary structures described but cover all relevant memory structures within the spirit and scope of the disclosure as described herein and as understood by one of skill in the art. The illustrations of the embodiments described herein are intended to provide a general understanding of the embodiments. Other embodiments may be utilized and derived from the disclosure, such that structural and logical substitutions and changes may be made without departing from the scope of the disclosure. This disclosure is intended to cover any and all subsequent adaptations or variations of embodiments. Those of skill in the art will recognize that such modifications are within the scope of the present disclosure.

The above-disclosed subject matter is to be considered illustrative, and not restrictive, and the appended claims are intended to cover all such modifications, enhancements, and other embodiments, that fall within the scope of the present disclosure. Thus, to the maximum extent allowed by law, the scope of the present disclosure is to be determined by the broadest permissible interpretation of the following claims and their equivalents, and shall not be restricted or limited by the foregoing detailed description.

What is claimed is:

1. A memory die, comprising:
   a plurality of memory cells;
   a calculation circuit configured to determine a difference between a write temperature and a read temperature in response to a read request received from a memory controller associated with the memory die for reading user data stored in a first memory cell of the plurality of memory cells; and
   a notification circuit configured to signal a cross-temperature condition to the memory controller in response to the difference satisfying a threshold.

2. The memory die of claim 1, further comprising a transfer circuit configured to send the user data to the memory controller upon receiving a re-read request from the memory controller in response to the cross-temperature condition.

3. The memory die of claim 1, wherein the read request comprises a read command and a cross-temperature read command.

4. The memory die of claim 1, wherein the read request comprises a single read command configured to read the user data from the first memory cell and to initiate a cross-temperature condition test.

5. The memory die of claim 1, wherein the memory die is configured to read the user data in a buffer associated with the memory die in response to the read request without sending the user data to the memory controller.

6. The memory die of claim 1, wherein the cross-temperature condition is indicated by a single bit value.

7. The memory die of claim 1, wherein the calculation circuit is configured to determine the write temperature for the user data from a buffer of the memory die to which the user data is read into from the first memory cell, and to determine the read temperature from a sensor on the memory die.

8. The memory die of claim 1, wherein the memory controller is coupled to the memory die and to each of a plurality of additional memory dies, and wherein each of the plurality of additional memory dies comprises an instance of the calculation circuit.

9. A memory die configured to:
   read data from a first memory cell to a buffer of the memory die in response to receiving a read request from a memory controller associated with the memory die, wherein the read request is to read the data from the first memory cell;
   before sending the data to the memory controller:
      determine a read temperature associated with the data;
      determine a write temperature associated with the data;
      calculate a difference between the read temperature and the write temperature; and
   send the data to the memory controller based upon the difference not satisfying a threshold or send an indicator to the memory controller based upon the difference satisfying the threshold.

10. The memory die of claim 9, wherein the memory die is further configured to receive a re-read request from the memory controller in response to the indicator signaling that the difference satisfies the threshold.

11. The memory die of claim 10, wherein the memory die is further configured to send the data to the memory controller in response to the re-read request.

12. The memory die of claim 9, wherein the memory die is further configured to determine the read temperature from a temperature sensor associated with the first memory cell, and wherein the memory die is configured to determine the write temperature from the buffer.

13. A non-volatile storage system, comprising:
   a memory controller; and
   a memory die comprising:
      a plurality of memory cells;
      a read circuit configured to read second data stored in a memory cell of the plurality of memory cells in response to a second read command received from the memory controller, wherein the second read command comprises a cross-temperature read command;
      a calculation circuit configured to calculate a difference between a write temperature and a read temperature for the second data in response to the second read command;
      a notification circuit configured to signal whether the difference satisfies a threshold to the memory controller; and
      a transfer circuit configured to send the second data read from the memory cell to the memory controller in response to determining that the difference does not satisfy the threshold;
   wherein the memory controller is configured to initiate error correction to read the second data in response to the signal indicating that the difference satisfies the threshold.

14. The non-volatile storage system of claim 13, further comprising a comparison circuit to determine whether the difference satisfies the threshold before the second data is transmitted to the controller.

15. The non-volatile storage system of claim 13, wherein the memory die is configured to receive the threshold from the controller.

16. The non-volatile storage system of claim 13, wherein the read circuit is configured to read the second data to a buffer associated with the memory die, and wherein the calculation circuit is configured to determine the write temperature from the buffer and to determine the read temperature from a sensor on the memory die.

17. The non-volatile storage system of claim 13, wherein the memory controller is configured to:
   receive first data from the memory die in response to a first read request;
   determine that an error count in the first data exceeds a limit; and
   send the second read command to the memory die in response to determining that the error count exceeds the limit.

18. A method comprising:
   receiving, by a memory device, a read request from a memory controller to read data stored on the memory device;
   reading, by the memory device, at least a portion of the data into a buffer on the memory device in response to the read request;
   determining, by the memory device, whether a difference between a read temperature and a write temperature for the data satisfies a threshold in response to the read request; and
   signaling, by the memory device, an indicator to the memory controller based upon the difference.

19. The method of claim 18, further comprising accessing, by the memory device, a subset of the data in the buffer that specifies the write temperature.

20. The method of claim 18, further comprising:
   receiving, by the memory controller, the indicator indicating that the difference satisfies the threshold; and
   sending, by the controller, a re-read request to the memory device in response to the indicator.

21. An apparatus comprising:
   a memory controller; and
   a memory die comprising:
      means for storing user data;
      means for receiving a request for the user data from the memory controller;
      means for calculating a difference between a write temperature and a read temperature for the user data, the write temperature and the read temperature associated with the user data identified by the request;
      means for comparing the difference to a threshold; and
      means for signaling whether the difference satisfies the threshold to the memory controller.

22. The apparatus of claim 21, further comprising means for deferring transmission of the user data from the memory die to the memory controller until after the difference is compared to the threshold.

* * * * *